( 12 ) United States Patent
Zaboronski et al.

(10) Patent No.: US 7,263,652 B2
(45) Date of Patent: Aug. 28, 2007

(54) MAXIMUM LIKELIHOOD DETECTOR AND/OR DECODER

(75) Inventors: Oleg Zaboronski, Coventry (GB); Andrei Vityaev, San Jose, CA (US)

(73) Assignee: Arithmatica Limited, Oxford (GB)

( * ) Notice: Subject to any disclaimer, the term of this patent is extended or adjusted under 35 U.S.C. 154(b) by 455 days.

(21) Appl. No.: 10/867,216

(22) Filed: Jun. 14, 2004

(65) Prior Publication Data

US 2005/0044474 A1 Feb. 24, 2005

Related U.S. Application Data

(60) Provisional application No. 60/478,069, filed on Jun. 12, 2003.

(51) Int. Cl.
*H03M 13/03* (2006.01)
(52) U.S. Cl. ............ 714/794; 714/795; 375/262; 375/341
(58) Field of Classification Search ............ 714/794–6, 714/791–792; 375/341, 262, 265
See application file for complete search history.

(56) References Cited

U.S. PATENT DOCUMENTS

| | | | |
|---|---|---|---|
| 4,644,564 A | 2/1987 | Dolivo et al. | |
| 5,042,036 A | 8/1991 | Fettweis | |
| 5,917,859 A | 6/1999 | Yamasaki et al. | |
| 2002/0021770 A1 | 2/2002 | Beerel et al. | |
| 2005/0094748 A1* | 5/2005 | Zaboronski et al. | 375/341 |

FOREIGN PATENT DOCUMENTS

GB 2383506 6/2003

OTHER PUBLICATIONS

"PTC Search Report filed in PCT/GB2004/002537", (Aug. 9, 2004), 5 Pages.
"United Kingdom Search Report filed in Application No. GB0413103.3", (Oct. 19, 2004), 1 Page.
Black, P. J., et al., "A 140-Mb / s, 32-State, Radix-4 Viterbi Decoder", *IEEE Journal of Solid-State Circuits*, 27(12), (1993), 1877-1885.
Fitzpatrick, K. K., et al., "A Difference Metric Implementatin for Maximum-Likelihood Sequence Estimation of Binary Input Intersymbol Interference Channels", *Communication Theory Mini-Conference, GLOBECOM '95, IEEE*, (1995), 860-864.

(Continued)

*Primary Examiner*—Guy J. Lamarre
(74) *Attorney, Agent, or Firm*—Schwegman, Lundberg, Woessner and Kluth P.A.

(57) ABSTRACT

A maximum likelihood detector receiving a data stream corresponding to ideal values which may include noise, and outputting information specifying a sequence of states of maximum likelihood selected from possible states corresponding to the data stream according to weighting value selections made by the processors, the ideal values being determined by the possible states, including: a pre-processor to obtain first weighting values; processors in a hierarchy, each processor in a select level of the hierarchy is programmed to use, respectively, a plurality of the weighting values to calculate subsequent weighting values indicating respective likelihoods that a section of the data stream values corresponds to each of a plurality of possible state sequences, for each possible initial state and each possible final state, to select further weighting value of highest likelihood corresponding to a state sequence from the initial state to the final state.

59 Claims, 9 Drawing Sheets

OTHER PUBLICATIONS

Fossorier, M. P., et al., "Differential Trellis Decoding of Convolutional Codes", *IEEE Transactions on Information Theory*, 46(3), (2000), 1046-1053.

Ölçer, S., et al., "Difference-metric Viterbi Decoding of Multilever Class-IV Partial-Response Signals", *IEEE Transactions on Communications*, 42(2/3/4), (1994), 1558-1570.

"PCT International Search Report filed in PCT /GB2004/002536", (Aug. 30, 2004),7 Pages.

"United Kingdom Search Report filed in Application No. GB0413104.1", (Oct. 13, 2004),1 Page.

Altekar, S. A., et al., "Improvements in Detectors Based Upon Colored Noise", *IEEE Transactions on Magnetics*, 34(1), (Jan. 1998),94-97.

Thapar, H. K., et al., "A Block Processing Method for Designing High-Speed Viterbi Detectors", *IEEE International Conference on Communications, BOSTONICC '89*, vol. 2, (Jun. 11, 1989),1069-1100.

* cited by examiner

PRIOR ART

MAXIMUM LIKELIHOOD DETECTOR AND/OR DECODER

The present application claims priority under 35 U.S.C. 119(e) to U.S. provisional patent application No. 60/478,069 filed Jun. 12, 2003, which application is hereby incorporated by reference.

FIELD

The present invention relates to methods and apparatus for data detection and/or decoding, and in particular, to maximum likelihood detectors and/or decoders and methods of maximum likelihood detection and/or decoding.

BACKGROUND

A random process can be defined on the set of states of a finite state machine. A corresponding sequence of random state transitions can be visualised as a path on a trellis diagram. The problem of finding the most probable trellis path which connects two given states is of a great practical importance. This problem arises in such diverse areas as the theory of error-free communication, adaptive planning, the theory of traffic flows. In applications related to communication theories, most probable path-searching algorithms are used to reduce noise from signals transmitted over noisy channels (CDMA2000, Gigabit internet, etc), combat both inter symbol interference and channel noise in magnetic and optical storage devices, maintain communications with deep space research probes (e. g. Galileo).

Markov processes with Gaussian randomness are of particular practical importance. An example is an additive Gaussian white noise (AWGN) communication channel. In this situation, the problem of finding the most probable path reduces to the problem of finding the path of lowest weighting on a trellis, whose branches are equipped with weightings which are real numbers called branch metrics. The latter problem can be solved using methods of maximum likelihood detection. Maximum likelihood detection may include detection of transmitted data and estimation of transmitted symbols which formed part of the data before the effect of noise and/or interference during transmission. Maximum likelihood detection may also include the further step of decoding the data from an encoded format, although this is not an essential feature of a maximum likelihood detector.

In the following discussion, the term "detection" includes the process of recovering signals that are subject to noise and/or known interference, such as inter-symbol interference (ISI) of a known shape. However, if a deliberate encoding process has also been performed on the data, "decoding" is required to recover the signals in their pre-encoded form. For example, if encoding has been performed on purpose to increase resistance of the transmitted signals to noise, then "decoding" can be used to obtain the original pre-encoded signals.

It follows that a "detector" does not require any decoding means for decoding from a deliberate encoding process. However, a detector which includes such decoding means for decoding from a deliberate encoding process may be known as a "decoder". The decoding means may be configured to work separately or integrally with the detection means. Thus, in the following discussion, a "decoder" is a type of detector which also performs decoding. The hard disk drive examples discussed below are maximum likelihood "detectors", because the process involved is recovery of signals, where no purposeful encoding was performed on the data. However, everything that is discussed below is also applicable to decoders.

Both detectors and decoders usually output an estimate of a signal before encoding or interference. However, it is possible for a decoder or a detector to output a different sequence, e.g. outputting encoded signals which are corrected for interference and/or noise, or correcting for transmission noise but not correcting for inter-symbol interference.

A prior art method known as the Viterbi algorithm (VA) is particularly well known for solving the above problem of finding the most likely path in a trellis. VA is a recursive procedure, which can be most easily described when used with a known initial state at time $t=0$, and a known final state at time $t=T$. VA allows the most likely sequence of states at intermediate times to be found. FIG. 1A shows an example of a two-state trellis diagram which can be used to visualise the VA process. The trellis diagram is a state transition diagram which graphically represents all of the possible states of the system over a sequence of time intervals. The horizontal axis of the trellis represents the times of the state transitions, starting at time $t=0$ at the left hand side of the trellis, and ending with time $t=T$ at the right hand side of the trellis. The vertical axis represents the possible states of the finite state machine. These possible states are zero and one. Pairs of possible states at adjacent time intervals are connected by lines, with each line representing a state transition. The possible sequences of states over the whole of the time period are represented by the possible paths along the trellis. At time $t=0$, the system is pre-set to state zero. At the next time interval, $t=1$, the state may remain as zero or change to one. This is represented by the darker upper and lower lines of the trellis between $t=0$ and $t=1$. A change of state from zero to one is represented by the upper line, extending diagonally upwards to connect to one at $t=1$, and a sequence of all zero states is represented by the lower line, extending horizontally to connect to zero at $t=0$. At time $t=1$, if the system is in state one, it may then follow one of two routes, i.e. remain at one, or change to zero. Similarly, if the system is in state zero, it may follow one of a further two routes, i.e. remain at zero, or change to one. At time $t=T$, the system is reset to zero.

As can be seen from FIG. 1A, the trellis contains one or more paths between each possible initial state and final state. For instance, there are two different paths from the "zero" state at time $t=0$ to the "zero" state at $t=2$. These paths are 010 and 000, where the first bit represents the state at time $t=0$, the second bit represents the state at time $t=1$, and the third bit represents the state at time $t=2$. FIG. 1B shows an identical trellis to FIG. 1A, with these two paths in bold lines. VA involves identifying paths between any possible states at time $t-1$, and each possible state at time $t$. If more than one path connects from $t-1$ to a particular state at time $t$, then VA chooses which of these paths corresponds to the most likely state sequence. Then, the least likely paths are eliminated. The remaining path is called the survivor.

The most likely path can be calculated using numbers known as branch metrics, which indicate the likelihood of each transition. FIGS. 1A and 1B show a number beside each line in the trellis, and this number is the branch metric for that state transition. The branch metrics for all state transitions in a path from time $t_1$ to time $t_2$ can be summed to indicate the likelihood of that particular path occurring. These sums of branch metrics are known as path metrics.

To find a survivor at a given state at time $t=t+1$, the path metrics of all paths leading to this state are computed by adding appropriate branch metrics to the path metrics of survivors at time t and choosing the path of lowest path metric (also known as the shortest path) leading to the state. This procedure is called add-compare-select operation and it has to be performed for all states at t=t+1. As t=T is reached, there will be only one survivor left, with probability P=1−$C_1 \cdot \exp(-C_2 \cdot T)$, where $C_1$ and $C_2$ are constants. Thus, the probability approaches 1 as time T increases and $C_1 \cdot \exp(-C_2 \cdot T)$ becomes small.

A specific example of the application of a use of VA in data transmission will now be described. When data is transmitted over a noisy channel, it is beneficial to encode the data first, using convolution encoding, to allow a degree of error correction. Convolution encoding is a bit level encoding technique where each coded bit is generated by convolving the input bit with the past input bits. Thus the information content of each input bit is spread over a number of coded bits, improving the error resistance of the data. If the encoded bits are then transmitted through a noisy environment, and if a particular encoded bit is very strongly affected by noise, information relating to the original input bits is still preserved in the encoded bits which are less affected by noise. The constraint length K of the convolution encoder is the number of bit shifts over which a single input bit can influence the encoder output. VA can then be used to detect and/or decode the convolution encoded data.

A convolution encoder can be represented by a generator function G(D), defined as follows:

$$G(D) = \sum_{n=0}^{K-1} g_n D^n,$$

where $D^n$ is a delay operator representing a delay of n time units, K is the encoder constraint length and $g_n$'s are real numbers, which describe the weight with which past transitions contribute to the current reading.

Another example of convolution encoding occurs in a hard disk read system. Each bit on the disk surface generates a magnetic field, which is detected by the disk read head in order to read the bit, but the read operation is also affected by the magnetic field produced by the neighbouring bits. Thus, any data value obtained in a read operation actually corresponds to a convolution of magnetically recorded bits on the disc. This is known as inter symbol interference (ISI).

VA may be used to decode convolution encoded data, encoded either by deliberate encoding or by an interference process such as inter symbol interference. Various types of a Viterbi detector may be used, depending on the constraint length of the encoder used to encode the data, and the weightings given to previous input data. One type of Viterbi detector is known as "PR4" (partial response system of class IV). "Partial response" refers to the fact that in a partial response system, e.g. in a hard disk drive read system, each bit on the disk gives a multi-bit detected sequence, rather than just a single bit. A PR4 system gives a two bit detected sequence, and the encoder output is constructed from the current encoder input minus a past input delayed by two time units, i.e. an output of $1-D^2$, where $D^2$ represents a delay of two time units. The following example illustrates a convolution encoder which has an output of 1−D, i.e. the encoder output is constructed from the current encoder input minus a past input delayed by one time unit.

FIG. 2 shows a block diagram of a prior art apparatus for transmission and reception of convolution encoded data. An encoder 100 performs convolution encoding of a stream of input data. The data is then sent over a noisy channel. Noise source 104 represents the effect of noise during transmission of the data. The transmitted data is then received and decoded by a maximum likelihood detector 108. The apparatus of FIG. 2 may represent a communications system, with deliberate convolution encoding of data to increase noise resistance during transmission through a channel. However, it may also represent a hard disk read process, in which the convolution encoding is not deliberate, but is a result of inter symbol interference caused by the magnetic fields of the individual data bits on the disk.

The encoder 100 has a constraint length of two, meaning that a single input bit of the encoder influences two bits of the received data. The encoder 100 has an input 101 for accepting a stream of time dependent input binary data $x_i$, where i represents the time interval. The input data is received by the encoder at a rate of k bits/second. The input 101 of the encoder 100 is connected to an encoder delay element 102. The delay element 102 stores a single bit of data, corresponding to the input bit $x_i$ at time i, and outputs this data bit at the following time interval i+1. Thus, at time i, the output of the delay element is $x_{i-1}$. The output of the delay element 102 is connected to a multiplication unit 103 which multiplies the output value $x_{i-1}$ by minus one, giving an output of $-x_{i-1}$. The encoder 100 has a sum unit 104 which is connected to both the encoder input 101 and the output of the multiplication unit 103. The signals $x_i$ and $-x_{i-1}$ are summed by the sum unit 104, to give an output signal of $y_i = x_i - x_{i-1}$.

The encoder output signal $y_i$ is sent from the output 105 of the encoder 100 via a channel, such as a radio link, a wire, or any other form of data transmission channel, to a detector 108. Noise source 106 represents noise $n_i$ generated as the signal $y_i$ passes through the channel. The noise source may generate Gaussian white noise, but the actual form of the noise generated does not have to be Gaussian, although in this example, it must be de-correlated noise. A sum unit 107, with inputs connected to the noise source 106 and the encoder output 105, represents the addition of the noise $n_i$ to the data $y_i$. Thus, the signal received after the data has passed through the noisy channel is $r_i = y_i + n_i$. The detector 108 receives the signal $r_i$, and the detector then performs a detecting and decoding process.

FIG. 3 illustrates the trellis diagram structure corresponding to the encoder of FIG. 2, and the method used by a VA detector 108 to detect the received data $r_i$. A series of eight trellis diagrams are shown, representing eight steps of the VA decoding process. A ninth trellis diagram shows a traceback of the optimal path through the trellis. The numbers on the trellis diagrams represent branch metrics, indicating the likelihood that received data corresponds to particular state transitions. Each trellis diagram is similar to that described with reference to FIG. 1, i.e. it has two possible states which are one and zero, and it extends from a known state zero at time t=0 to a known state zero at time t=T. The known states of zero can be set by feeding an initial zero to the encoder to re-set the state of the delay element to zero, and then by transmitting an extra character of zero at the end of the data transmission. A path through the trellis represents a sequence of data which is input to the encoder. Any unique data sequence input to the encoder has a unique path through the trellis.

The state of the trellis, with a value of zero or one, represents a possible value of $x_{i-1}$. $x_{i-1}$ is a possible value of the convolution encoder input, which may be stored in the delay element 101. The possible values of the convolution encoder output $y_i=x_i-x_{i-1}$ are thus represented by the slope of the lines connecting two states of the trellis at adjacent time intervals i−1 and i. The $y_i$ values also represent ideal values of the received data, without any added noise $n_i$. Lines with a zero slope, (such as state zero at t=0 and state zero at t=1) correspond to $y_i$=0. Lines with a left-to-right upwards slope (such as state zero at t=0 and state one at t=1) correspond to $y_i$=1. Lines with a left-to-right downwards slope (such as state one at t=1 and state zero at t=2) correspond to $y_i$=−1. The values of $y_i$ are known as "branch labels" of the trellis. The branch labels can be used together with the received data to obtain the branch metrics of the trellis, as will now be described.

When the detector 108 receives the transmitted signal, this received signal $r_i$ includes noise $n_i$. Thus, the problem to be solved by the detector is to determine the most likely path through the trellis (i.e. the most likely sequence of characters input to the encoder), based on the noisy received signal. Branch metrics are assigned to the trellis, to indicate the likelihood of each state transition. For Gaussian white noise, the branch metrics can be calculated as $(r_i-y_i)^2$, i.e. the square of the difference between the received value $r_i$ and the expected value $y_i$ for that particular state transition. The most likely path is the path with the lowest total weight, i.e. the lowest sum of branch metrics.

When branch metrics are calculated as $(r_i-y_i)^2$ for the 2-state trellis of FIG. 3, it is common to get a lot of paths having equal path metrics. It may not always be possible, therefore, to choose a single path of greatest likelihood, as one of two equally likely paths must be chosen. Therefore, for the purposes of illustrating the technique of finding a unique path through the trellis using VA, the values shown on FIG. 3 as branch metrics have not been calculated from a chosen set of $r_i$, but instead, short integers have been chosen for each branch metric to ensure different weights for each path. In practice, although the presence of multiple paths of equal likeliness degrades the VA performance, it is often possible to pre-process the data to avoid getting large numbers of equally likely paths.

The first trellis diagram, at the top of FIG. 3, corresponds to step 1 of the detection and/or decoding process. Step 1 concerns the time interval between t=0 and t=1. The state of the system at t=0 is zero, because the delay element was preset to zero before data transmission began. Two possible paths through the trellis during the first time interval are identified as bold lines on the trellis. These correspond to data sequences of 00 and 01 respectively, where the first bit represents the state at time t=0 and the second bit represents the state at time t=1. The 00 path is the lower of the two paths in the trellis, and the 01 path is the higher of the two paths in the trellis. The 00 path has a path metric of 0, but the 01 path has a path metric of 2. As only a single path is formed between the initial state at t=0 and each final state at t=1, no reduction of the trellis is performed at step 1.

The second trellis corresponds to step 2 of the decoding process. The part of the trellis between t=0 and t=2 is now considered. A total of four paths are now possible, namely, 000, 001, 010 and 011, where the first two bits represent the possible paths in step 1, and the third bit represents the state at time t=2. The path metric of each path may be calculated by adding the branch metrics for each state transition on the path. Thus, the path metric of 000 is 0+2=2, of 001 is 0+0=0, of 010 is 2+1=3, and of 011 is 2+1=3. The paths 000 and 010, with path metrics of 2 and 3 respectively, both lead to a final state of 0 at time t=2. Therefore, the 010 can be eliminated, as it has the highest path metric, and the 000 path is the survivor. Similarly, the paths 001 and 011, with path metrics of 0 and 3 respectively, both lead to a final state of 1 at time t=2. Thus, the 011 path can be discarded, and the 001 path is the survivor. The two survivor paths, 001 and 000, are shown in bold on the trellis diagram.

In step 3 of the process, the part of the trellis up to t=3 is considered. The four new possible paths are 0010, 0011, 0000 and 0001, with path metrics of 0, 0, 3 and 4 respectively. The path 0000 with path metric 3, and the path 0001 with path metric 4, can both be eliminated, as these have highest path metrics for final states 0 and 1 respectively. Thus, the survivors are 0010 and 0011, each with a path metric of 0.

In step 4 of the process, the part of the trellis up to t=4 is considered. The four new possible paths are 00100, 00101, 00110 and 00111, with path metrics of 1, 2, 2 and 0 respectively. The paths 00101 and 00110 can be eliminated, as these have highest path metrics for final states 1 and 0 respectively. Thus, the survivors are 00100 and 00111, each with a path metric of 0.

In step 5 of the process, the part of the trellis up to t=5 is considered. The four new possible paths are 001000, 001001, 001110 and 001111, with path metrics of 3, 3, 1 and 0 respectively. The paths 001000 and 001001 can be eliminated, as these have highest path metrics for final states 0 and 1 respectively. Thus, the survivors are 001110 and 001111, with path metrics of 1 and 0 respectively.

In step 6 of the process, the part of the trellis up to t=6 is considered. The four new possible paths are 0011100, 0011101, 0011110 and 0011111, with path metrics of 3, 2, 2 and 1 respectively. The paths 0011100 and 0011101 can be eliminated, as these have highest path metrics for final states 0 and 1 respectively. Thus, the survivors are 0011110 and 0011111, with path metrics of 2 and 1 respectively.

In step 7 of the process, the part of the trellis up to t=7 is considered. The four new possible paths are 00111100, 00111101, 00111110 and 00111111, with path metrics of 2, 4, 3 and 3 respectively. The paths 00111110 and 00111101 can be eliminated, as these have highest path metrics for final states 0 and 1 respectively. Thus, the survivors are 00111100 and 00111111, with path metrics of 2 and 3 respectively.

In step 8 of the process, the part of the trellis up to t=8 is considered. At t=8, the state is set to zero, since a reset signal will be sent at the end of the transmission. Thus, only two paths need be considered instead of four. The two paths are 001111000, 001111110, with path metrics of 2 and 4 respectively. As both paths have the same final state, the path 001111110, which has the highest path metric, can be eliminated. Thus, the only survivor is 001111000, with a path metric of 2.

The ninth trellis shows traceback of the path with the lowest overall path metric, where only the final survivor path is shown in bold, and dead-end paths are no longer shown in bold.

In the absence of any additional noise $n_i$, the received data input to the detector or decoder is an "ideal input". For a trellis of finite length, an ideal input is a sequence of received data with a corresponding path in the trellis which has a path metric of zero. In other words, for an ideal input, there is a corresponding path which has a sequence of branch labels which is equal to the sequence of received data.

Using VA, the number of steps needed to find the shortest path on a trellis of length N is O(N), which can lead to a prohibitively large computation time. Standard methods of speeding implementations of VA rely on deep pipelining, which leads to large latency delays and increased complexity of implementation due to necessity to manage large amount of memory needed to store information about survivors and their path metrics.

One high speed alternative to the Viterbi algorithm is the Fettweis approach, described in U.S. Pat. No. 5,042,036. Fettweis is a two step process. Firstly, the trellis is divided into multi-step sections, each of length M. Within each of these sections of length M, the least likely paths are eliminated. To do this, Fettweis considers in turn each possible initial state at the start of the length-M section, and considers a subset of the trellis beginning at that state. Depending on the Markov process on which the trellis is based, it is highly likely that after a certain number of state transitions, the highest-likelihood path through the trellis will become independent of the initial state. Fettweis defines a number F, such that after F states, all of the paths are highly likely to converge. E.g. the first F states will depend on the initial state chosen, but after that, all paths will be the same, regardless of which initial state was chosen. F is dependent on the trellis diagram and the initial values of the branch metrics.

Fettweis makes use of this high likelihood of path convergence to reduce part of the trellis to a single path, even though the initial and final states are not previously known. Thus, Fettweis does not need to actually calculate the path through the trellis for every possible initial state of the section. The whole path through the section can be calculated for just one initial state, and then only the first part of the path (which is dependent on the initial state) needs to be calculated for all other initial states. The ability of the Fettweis method to find a likeliest path without knowledge of the initial and final states allows VA to be parallelised, with several sections of length M being reduced in parallel.

When sections of the trellis have been reduced to a single path using the Fettweis method, the sections are re-connected to find the most likely complete path. It is possible to choose overlapping trellis sections to be reduced to connecting sections of single path, so that no further calculation is needed to find the complete path. It is also possible to choose trellis sections to be reduced to obtain a trellis with intermittent sections of single path, and to use standard VA either forwards or backwards from known reduced sections of the path to determine the unknown parts of the path.

However, Fettweis has the considerable disadvantage that the basic sections of input data must each be greater in length than 5K (i.e. 5 times the constraint length). This is because, as a general rule, the non-converging length F which occurs at the start of each section of input data must have a length of 5K or more. The exact value is dependent on the particular structure of the trellis diagram and the values of the branch metrics, however, F will always be at least 5K, due to the need to assign zeros to the start of the sequence, and due to the minimum length required for statistical convergence of the paths from different initial states. In practical maximum likelihood detectors, it is frequently undesirable to use input data sections of such a long length.

A further disadvantage of Fettweis is the large latency between data input to the detector and decoded data output from the detector. This latency is prohibitively high for many practical applications.

SUMMARY

The present invention provides a maximum likelihood detector for reducing noise within a sequence of data values by outputting information specifying one or more particular sequences of states selected from a plurality of possible states. Different state sequences are each allocated a weighting value according to their likelihood, and one or more such state sequence is chosen, according to its likelihood.

The data values may have been deliberately encoded e.g. using convolution encoding, but may then have been altered by the addition of noise, e.g. during transmission in a communication channel. Alternatively, the data values may have been obtained in a convolution encoded format arising from a non-deliberate process such as interference, e.g. when reading data from a magnetic disk drive. A further possibility is that the data values may be for fitting to a finite state model, such as in a voice recognition system. The maximum likelihood detector according to embodiments of the invention is capable of reducing the amount of de-correlated noise, such as Gaussian white noise, from received data. Each weighting value indicating likelihood may be calculated as the square of the difference between the received data value and an ideal received data value, where an ideal value is a value without said added noise. Alternatively, a different formula may be used to calculate the weighting values.

If there is no correlation between the noise affecting each received signal then the noise is referred to as white, otherwise it is referred to as coloured. So far the discussion has centred on white noise. In the presence of coloured noise, the implementation of the maximum likelihood decoding or detection is modified. Further embodiments of the invention may be used to reduce the amount of coloured noise, provided that the correlation length of the coloured noise is smaller than the length of the shortest state sequence to be eliminated.

Certain implementations result in modifications to the received signals before entering the detector/decoder and the use of a different generator polynomial. In such instances the structure of the maximum likelihood detector/decoder is unaltered and all observations made so far still hold.

Other implementations result in a detector/decoder that accepts an input signal that instructs the unit to change the generator polynomial being used. Once a generator polynomial has been selected however all previously made observations still hold.

One particular approach to treating coloured noise relies on processing blocks of received signals. As discussed in "Improvements in Detectors Based Upon Colored Noise" in IEEE Transactions on Magnetics, Vol 34, No. 1, January 1998 by Shirish A. Altekar and Jack K Wolf, it is possible to modify the path metrics calculations, e.g. by approximating the correlation matrix of noise with a block diagonal matrix, in order to improve the performance of Viterbi detectors for coloured noise, without increasing the number of states.

One method is to modify the path metric calculation is by using noise prediction, in which estimates of previous noise samples are used to provide partial local feedback during path metric calculation. Instead of simply calculating a branch metric as the square of the difference between an ideal received data value and the actual received data value, an additional term is also subtracted from that difference in order to take noise prediction into account. A second alternative method is to set up the Viterbi detector to operate on blocks of input data. The branch metric is calculated using vectors with components corresponding to the difference between ideal received data values and the actual received data values within a block, and operating on the vectors using a correlation matrix representing the effect of the noise. The correlation matrix may be calculated as the autocorrelation matrix of a sequence of noise samples. The path metrics are summed across blocks in the same way as for white noise. This second method is feedback free.

In embodiments of the invention, a buffer may be provided for holding the received data, and the buffer may be designed to hold at least $K^n$ data items, where K is the constraint length, and n is the number of steps necessary for decoding. Any additional data in the buffer may be held until the next batch is to be processed.

The size of each said section of input data may be less than five times the minimum number of input data values necessary to have a plurality of different possible state sequences between a given initial state of the section and a given final state of the section. This is not possible using a Fettweis detector. For embodiments of the present invention, each section of input data may have the minimum number of input data values necessary to have a plurality of different possible state sequences between a given initial state of the section and a given final state of the section. In the examples shown, the minimal section length is equal to the constraint length.

The maximum likelihood detector of one embodiment of the invention has an input for receiving the sequence of input data values; a storage configured for storing possible sequences of states which may correspond to the received data, a pre-processing unit for calculating weighting values (otherwise known as branch metrics) representing likelihoods that each received data value corresponds to each possible ideal value for the received data, and a plurality of processing units arranged in a hierarchical structure for parallel elimination of less likely state sequences using the calculated branch metrics. The processing units may be arranged in a tree structure, for example, a binary tree or an asymmetric tree structure. The pre-processing unit may be adapted to calculate said likelihoods for input data from each of said sections in parallel.

When the input data is received, it is divided into a plurality of sections. The branch metrics may be calculated before or after the data is divided into the sections. Each section is then processed by a processing unit on the lowest level of the hierarchy, to eliminate some of the possible state sequences, i.e. some of the less likely transmitted signal estimates. This can be done by summing branch metrics of the in each possible state sequence to produce a sum for each sequence, known as a path metric, and selecting the path metric of highest likelihood between each possible initial state and each possible final state. State sequences without the selected path metric can be eliminated from a list of possible state sequences.

The path metrics of state sequences constructed from adjacent sections are then calculated by a processing unit on the next level of the hierarchy, by summing a selected path metric for each section. This can eliminate further possible state sequences. This process may continue in a hierarchical structure until, at the processing unit at the top of the hierarchy, all but one of the possible state sequences have been eliminated between an initial state of the first section and a final state of the last section.

Alternatively, it may be desired to retain all possible state sequences with a likelihood above a given threshold, or to retain a chosen proportion of the most likely possible state sequences.

The detector may be configured to use hard inputs and outputs, or soft inputs and/or outputs. Hard values are when a single state is selected for each time interval, and information specifying the single sequence of states of highest likelihood is output. Soft values allow more flexibility, giving an output which reflects the probability of more than one possible output. For example, the detector may output information specifying all possible state sequences with a probability above a given threshold. Alternatively, information specifying a proportion of the most likely state sequences may be output, together with an indication of their relative likelihoods.

Particularly, but not exclusively, in a hard input/output detector, the detector may deal with two state sequences of equal likelihoods by choosing one of them at random or using a predetermined selection rule. The data may be pre-processed before decoding, or the detector may be provided with a pre-processor, to convert the data into a format which will reduce the number of equally likely state sequences.

Where the detector is used for decoding convolution encoded data, each processing unit may process a section of data with a size equal to the constraint length K of the encoder used to encode the data. Alternatively, the size may be larger than K, although preferably, it is less than 5K. For the detector of FIG. 2, K=2, and for an E2PR4 detector, K=5.

The first level processing units may be configured to receive a signal indicating the value of K for a particular data set, and adapt to use that value of K for that particular data set. This allows an encoder to be able to deal with different types of input data.

In one embodiment of the invention, the output values of the detector may be identical to the ideal input values of the detector. However, in a further embodiment, the ideal input values of the detector may correspond to the convolution encoded output values of the detector. A further embodiment may also include an output to output data in a user specified format.

The present invention allows the shortest path on the trellis to be found using parallel processing, as compared to the sequential nature of the Viterbi algorithm. This has the advantage that the data may now be received at a faster rate than the rate at which it can be sequentially processed. Thus, the effective rate of transmission is increased beyond that of VA.

Unlike Fettweis, which uses a fixed trellis, in embodiments of the present invention the trellis is re-defined after every step of the process, by eliminating the least likely of multiple paths of length larger than or equal to the constraint length at each step. Embodiments of the present invention avoids the disadvantage of needing to use sections of input data of length 5K or greater. The problem with a large latency, which occurs in a Fettweis detector, can also be avoided.

The present invention can be implemented by software or programmable computing apparatus. Thus the present invention encompasses a carrier medium carrying computer readable code for controlling a computer or number of computers to carry out the method. The carrier medium can comprise a transient medium, e.g. an electrical, optical, microwave, RF, electromagnetic, acoustic or magnetic signal (e.g. a TCP IP signal over an IP network such as the internet), or a carrier medium such as a floppy disk, CD ROM, hard disk, or programmable memory device.

In the present invention, the ideal detector input values may be noise-free values, values with reduced noise, or values with a reduced noise component, compared with the noise in the originally received data. "Noise" may include, for example, transmission noise, transmission interference, timing error, jitter, misequalization, inter-track interference, DC-offset, non-linear bit shift, overwrite, particulate noise, transition noise and/or percolation. Some embodiments of the present invention may be effective in reducing a first type of noise, but less effective in reducing a second type of noise which is also influencing the data.

In some embodiments of the invention, the detector is configured to decode a discrete number of data values, and when the data is generated (e.g. by a convolution encoder), it can be set up to have known initial and final states. For example, a convolution encoder with delay elements for storing previous data values may be reset prior to encoding any data, by resetting each delay element to zero. Similarly, extra zero values may be added to the data after the last "proper" data value, in order to put the encoder into a known final state.

The maximum likelihood detector may be configured to decode discrete chunks of input data by calculating state sequences of highest likelihood using a predetermined first and last state. Alternatively, to allow continuous decoding, the most likely sequence may be calculated for each of a plurality of possible first and last states.

Embodiments of the invention may be used to adapt a prior art continuous decoding technique known as continuous Viterbi, or sliding-window Viterbi (VA). Sliding-window VA can be used to decode a continuous stream of input data, and has the advantage over standard VA that it does not require periodic re-setting of delay elements to zero. This allows the speed of data transmission to be increased. Sliding-window VA involves a step which is identical to standard VA, and this step can be replaced by a method according to the present invention.

BRIEF DESCRIPTION OF DRAWINGS

Embodiments of the present invention will now be described, by way of example only, with reference to the accompanying drawings, in which.

DESCRIPTION

A first embodiment of the present invention will now be described with reference to FIG. 4. In this first embodiment, three steps are used to reduce the trellis. A traceback process is used to determine the most likely path.

The method used in this embodiment for finding the shortest path on a trellis is based on the following. If there are two or more paths leading from state S(T) to state S(T+k), where k is an integer depending on the trellis structure, then these paths form a loop. The shortest path passing through the states S(T) and S(T+k) will necessary go through the shortest path out of all paths forming the loop. All paths forming a given loop can therefore be analysed, the shortest path chosen, and all other paths discarded. This procedure is called loop erasure. Different loops can be erased independently thus allowing loop erasure in parallel.

A fully parallel algorithm of finding the shortest path on a trellis, which is based on loop erasure can be organised as follows.

Divide the trellis into the smallest time slices such that any state at the beginning of the slice is connected to any state at the end of the slice via a loop.

Erase all loops in all slices of the trellis in parallel. The result is a new trellis, which is $k_{min}$-times shorter than the original trellis, where $k_{min}$ is the length of time slices containing loops of minimal length. Branches of the new trellis are labelled by the lengths (path metrics) of paths of length $k_{min}$, which survived loop erasure.

Repeat the above two steps until the trellis consisting of a single loop is obtained. Erasing of this loop produces the shortest global path on the original trellis.

Note that loop erasure in each section of the algorithm is performed independently in each time slice. Therefore, it can be performed in parallel. Due to the fact that erasure of all loops in a trellis results in a new trellis, which is at least two times shorter than the original one, the algorithm described above finds the shortest path after at most $\log_2(N)$ repetitions of the first two steps, where N is the length of the original trellis.

Figure 3:
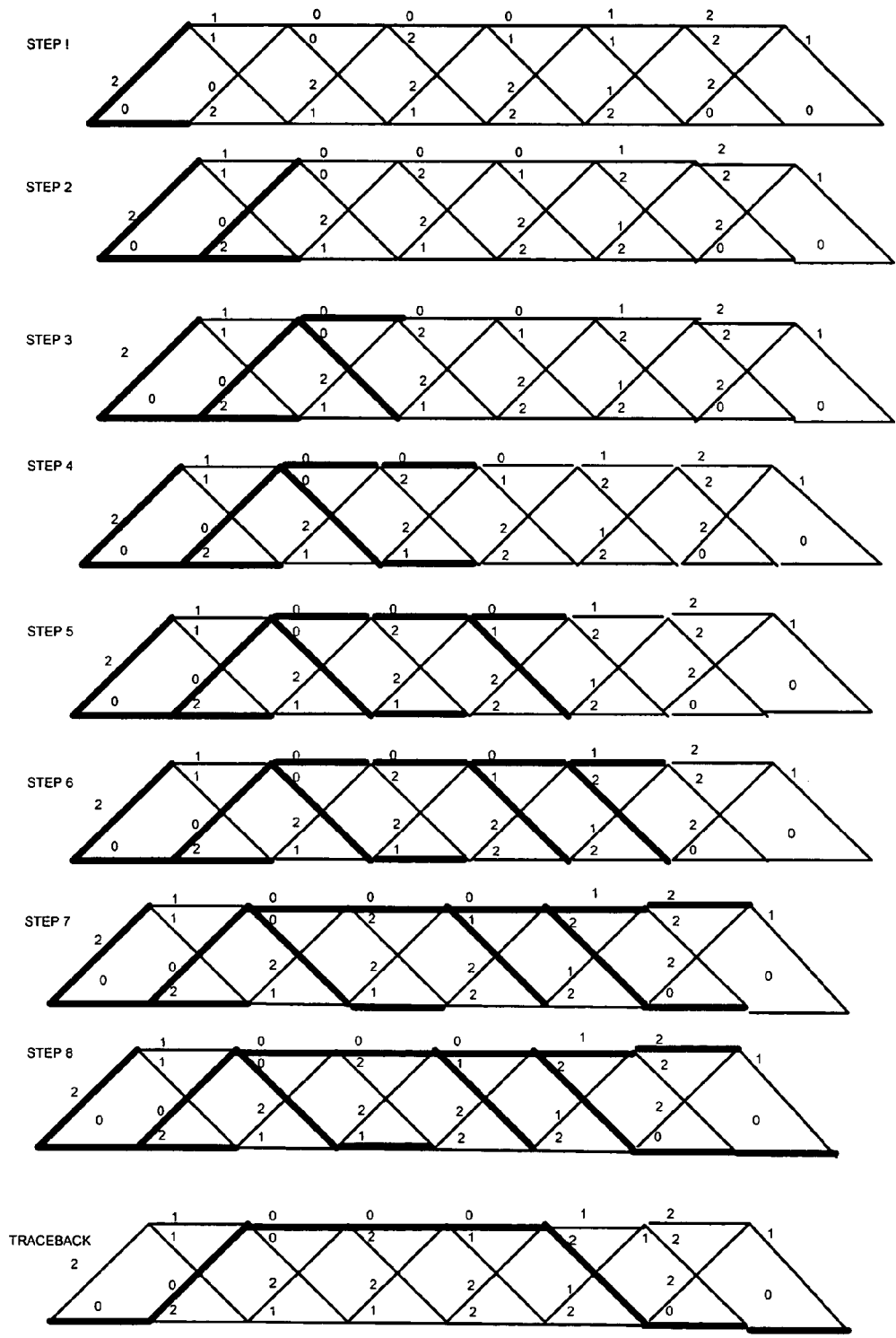
FIG. 3 is a series of trellis diagrams representing a series of steps in a Viterbi decoding process, according to the prior art.

Mathematically, the loop-erase algorithm relies on the factorisation of the space of all paths on a trellis into a direct product of spaces of loops on the trellis. FIG. 4 shows the application of loop erase algorithm to finding the shortest path on the two-state trellis which was analysed in FIG. 3 using VA. Notice the reduction in the number of steps LEA needs to find the shortest path compared with VA.

Figure 1A:
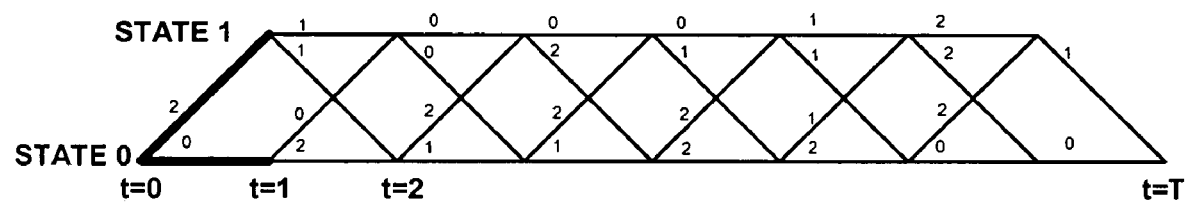
FIGS. 1A and 1B show an example of a trellis diagram representing a two-state time dependent process as known in the prior art.
Figure 1B:
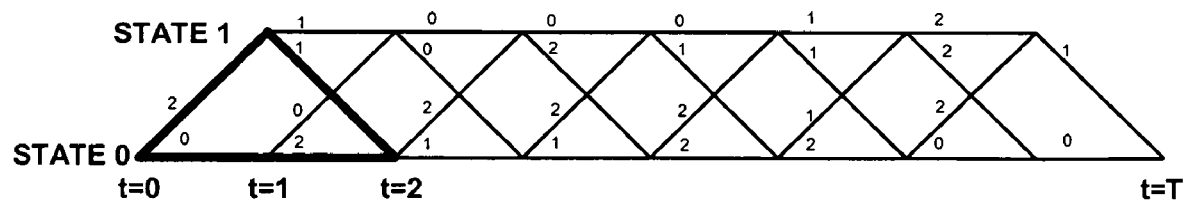
Figure 4:
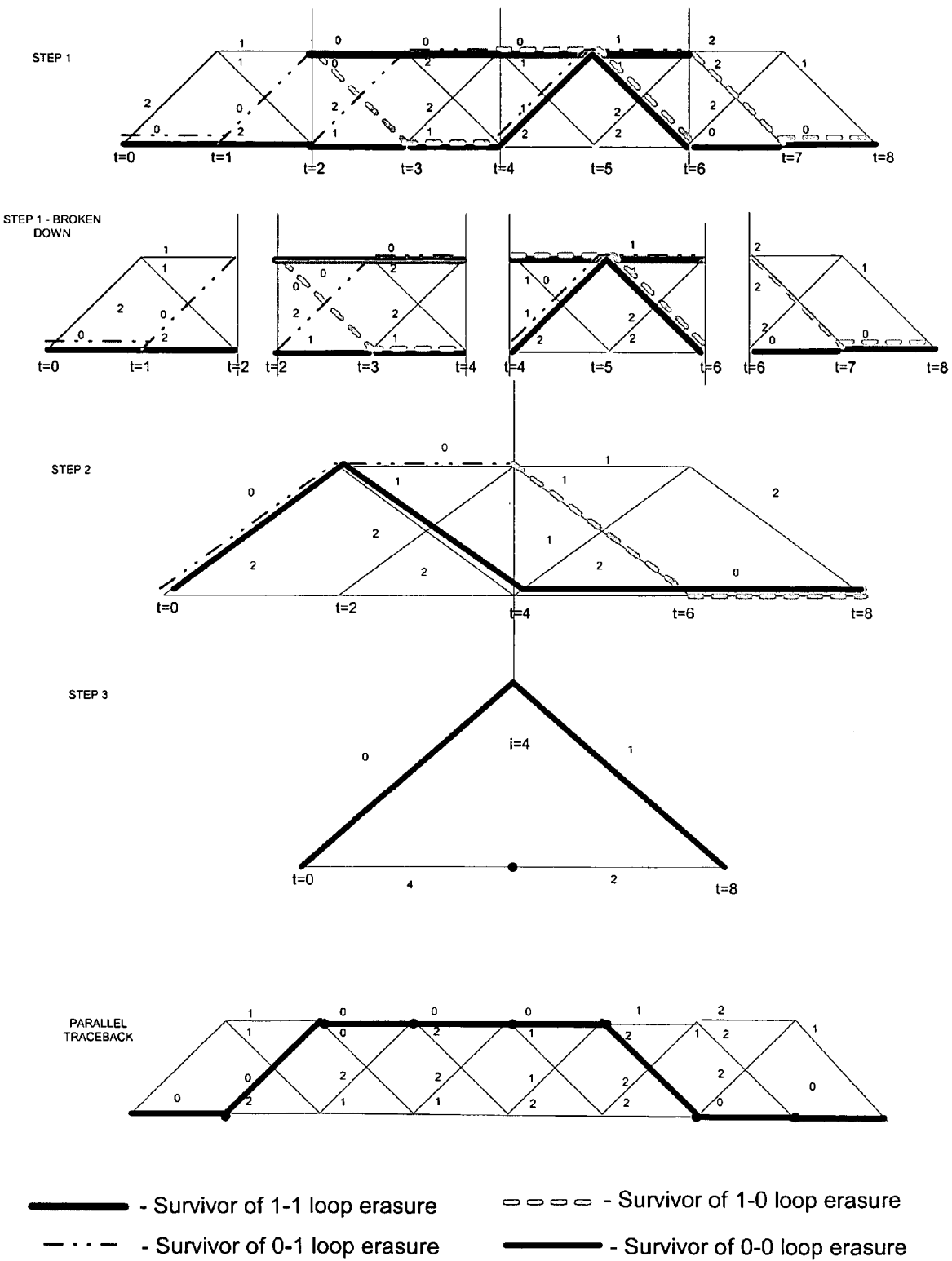
FIG. 4 is a series of trellis diagrams representing a series of steps in the decoding process according to a first embodiment of the invention.

The first trellis of FIG. 4 corresponds to the first step in the loop erase process. As in the case of FIGS. 1 and 3, the trellis is a two-state trellis, and it both starts and ends on state zero at time intervals t=0 and t=8 respectively. As in the example of FIG. 3, the branch metrics which are indicated beside each state transition should be calculated by taking the square of the difference between the received signal and the expected signal for that path. Again, for the sake of clarity, actual calculated values are not used, but a small integer has been selected for each transition.

The first stage of reduction involves dividing the trellis into sections of length K, where K is the constraint length of the encoder, which is equal to the minimum guaranteed loop length. In this example, K=2, because each bit passing through the encoder can influence the encoder output over a length of two output bits, i.e. once when it is added to the delay element contents, and again when it is the delay element contents. Thus, the trellis is divided into sections each having two state transitions. Since the trellis has a total of eight state transitions, it is divided into four parts.

The second trellis diagram of FIG. 4 shows the trellis of step 1, divided into four parts. Each of the four parts of the trellis may now be dealt with in parallel, thus speeding up the decoding process. Each part of the trellis has a loop made up of two different paths connecting each initial state to each final state. One path can be eliminated in each loop by comparing the path metrics of the two paths. Thus, in the first part of the trellis, the first loop consists of paths 000 and 010, and the path metrics (calculated in the same way as in FIG. 3) are 2 and 3 respectively. Thus, the 010 path can be discarded. Similarly, the second loop has paths 001 and 011, with path metrics 0 and 3 respectively. Thus, the 011 path can be discarded.

The path reduction of the first part of the trellis is identical to standard VA. However, instead of reducing the first part of the trellis and then proceeding serially through the rest of the trellis, in this embodiment of the invention, all four parts of the trellis are reduced in parallel.

The second part of the trellis has paths 000, 010, 001, 011, 100, 110, 101, 111, with branch metrics 2, 4, 3, 2, 1, 2, 2 and 0 respectively. The paths 010, 001, 110 and 101 can therefore be eliminated, as they have higher path metrics than the other paths in the same loops. The survivors are therefore 000, 010, 100 and 111.

The third part has paths 000, 010, 001, 011, 100, 110, 101, 111, with branch metrics 4, 2, 4, 2, 3, 1, 3 and 1 respectively. The paths 000, 001, 100 and 101 can therefore be eliminated, as they have higher path metrics than the other paths in the same loops. The survivors are therefore 010, 011, 110 and 111.

The fourth part has paths 000, 010, 100, 110, with branch metrics 0, 3, 2 and 3 respectively. The paths 010 and 110 can therefore be eliminated, as they have higher path metrics than the other paths in the same loops. The survivors are therefore 000 and 100.

After step 1, the new trellis still has multiple paths along its length, but the new trellis has only half the number of paths as the original trellis. The new trellis can be re-drawn with only the remaining paths, as shown at step 2. The branch metrics of the new trellis correspond to the path metrics of the surviving paths of the original trellis. Each time interval of the new trellis, shown in step 2, corresponds to two time intervals of the original trellis, shown in step 1.

The process of dividing the trellis into sections is now repeated for the new trellis, i.e. dividing the trellis into two parts, each having two state transitions.

The first part of the trellis of step 2 has paths 000, 010, 001, 011 with branch metrics 4, 1, 4 and 0 respectively. The paths 000 and 001 can therefore be eliminated, as they have higher path metrics than the other paths in the same loops. The survivors are therefore 010 and 011.

The second part of the trellis of step 2 has paths 000, 010, 100, 110, with branch metrics 2, 3, 1 and 3 respectively. The paths 010 and 110 can therefore be eliminated, as they have higher path metrics than the other paths in the same loops. The survivors are therefore 000 and 100.

The process of dividing the trellis into sections is now repeated for the new trellis, i.e. dividing the trellis into two parts, each having two state transitions. The trellis can be redrawn, including only the remaining paths from the trellis of step 2. Each time interval on the new trellis corresponds to two time intervals of the trellis of step 2, and the branch metrics correspond to the paths metrics of the surviving paths from the trellis of step 2.

As all other paths have now been eliminated, the trellis of step 3 only has two paths 000 and 010, with branch metrics 6 and 1 respectively. The path 000 can therefore be eliminated, as it has the higher path metric in the loop. The single survivor is therefore 010.

The path metric of the single surviving path, which is 1, is now known, and the state at time t=4 from step 3 is also now known, but it is necessary to trace back to find the path at each intermediate time t. This is done using a traceback unit.

During the processing of step 1, the surviving paths were stored in a path memory. Some of these surviving paths were eliminated by step 2, leaving only two paths. One of these two surviving paths was eliminated by step 3, leaving only one path. That path can be retrieved from memory to output the result.

Figure 5:
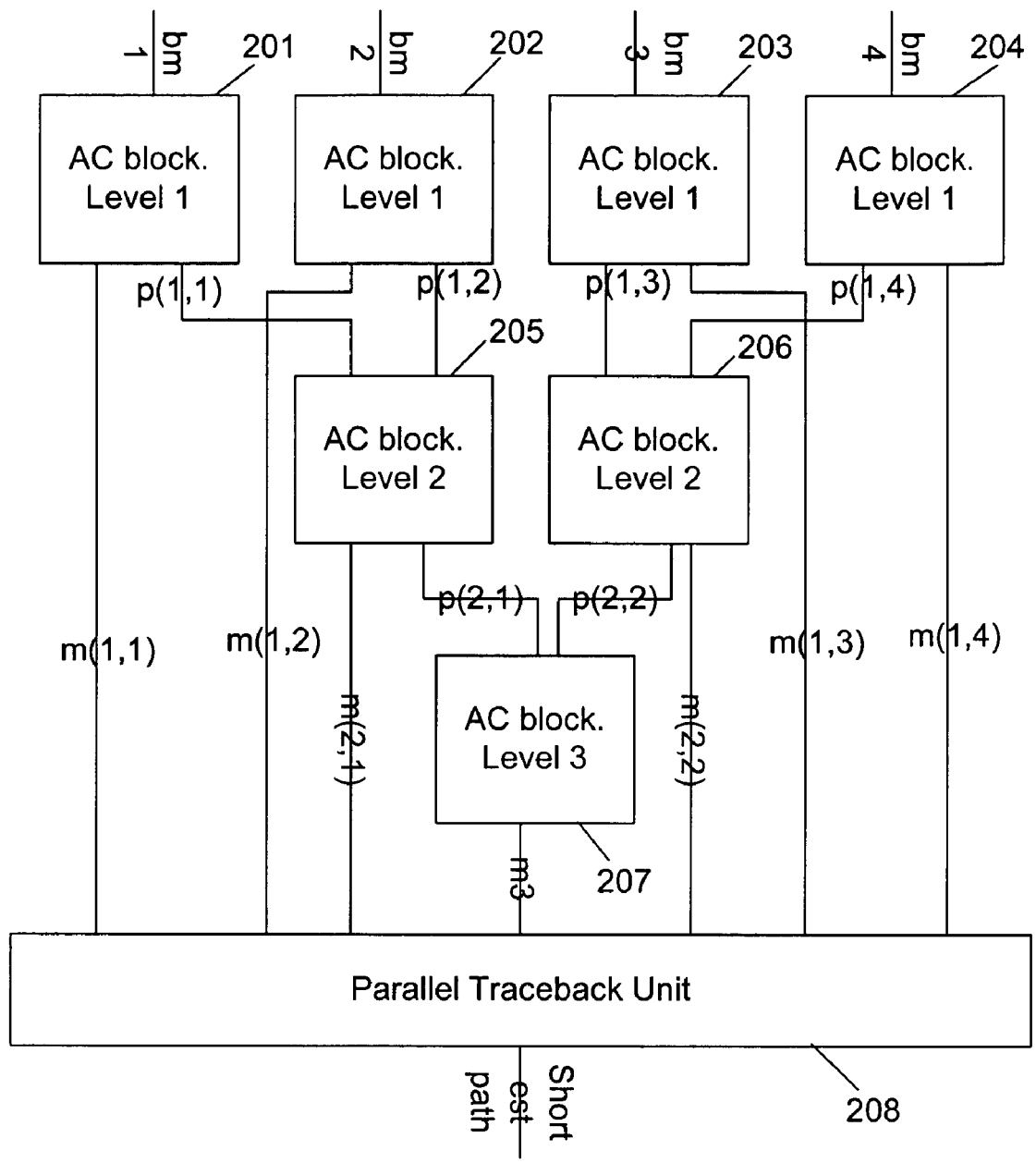
FIG. 5 is a block diagram of a decoding apparatus, according to the first embodiment of the invention.

FIG. 5 shows a block diagram of a parallel detector according to the first embodiment of the invention. The parallel detector has a set of four first-level add-compare (AC) blocks 201, 202, 203, 204, a set of two second-level AC blocks 205, 206, and a single third-level AC block 207.

First-level add-compare blocks 201, 202, 203, 204 compute path metrics of all paths on the original trellis constituting loops of minimal length, and then erase these loops by deleting the least likely path in each loop. They output path metrics $p_1$'s and binary codes $m_1$'s of paths, which survived loop erasure. Each of the four first-level blocks has an input for receiving one set of branch metrics, bm1, bm2, bm3 or bm4, for one of the four sections of the trellis. It then calculates the path metrics for that section of the original trellis, using the branch metrics. The path metrics p(1,1) and p(1,2) from the first 201 and second 202 AC blocks respectively are input to a second level AC block 205. Similarly, the path metrics p(1,3) and p(1,4) calculated by the third 203 and fourth 204 blocks respectively are input to a further second level AC block 206.

Add-compare blocks of second-level accept path metrics from first-level as inputs. These path metrics play the role of branch metrics for the reduced trellis. Add-compare blocks of level two compute path metrics of paths constituting minimal loop on second-level trellis and erase loops. They output path metrics $p_2$'s and binary codes $m_2$'s of surviving paths. The second level AC blocks calculate the path metrics for the reduced trellis of step 2 in FIG. 3. The path metrics p(2,1) and p(2,2) from the two second level AC blocks 205, 206 are input to a third level AC block 207.

Add-compare block of third-level accepts path metrics from second-level as inputs. These path metrics play the role of branch metrics for the reduced trellis of third-level. Add-compare block of third-level computes path metrics of paths constituting minimal loop on third-level trellis and erases this last loop. It outputs binary codes $m_3$ of the surviving path. The third level block reduces the two-path trellis of step 3 in FIG. 4, leaving a single path. During the calculation at each level, the path data is sent from each of the blocks to a parallel traceback unit 208, which reconstructs the shortest path, and outputs this information.

Parallel trace back unit inputs binary codes of surviving paths $m_1$, $m_2$ and $m_3$. Using the structure of binary comparison tree it determines the sequence of states (or a decoded message in case of applications to communication) describing surviving path in $O(\log_2(N))$ steps.

Embodiments of the invention include PR4 type decoding processes, and alternatively may include more complex processes. For example, FIGS. 6 and 7 respectively show a block diagram of a E2PR4 encoder, and a corresponding trellis diagram. E2PR4 encoders are more complicated than PR4 encoders because they decode data with a larger constraint length K. For example, in hard disk read systems, this may arise due to more dense writing of data bits to the disc, such that more than just a single neighbouring bit is effected by the magnetic field of any particular bit. In the example now given, the constraint length K is five.

Figure 6:
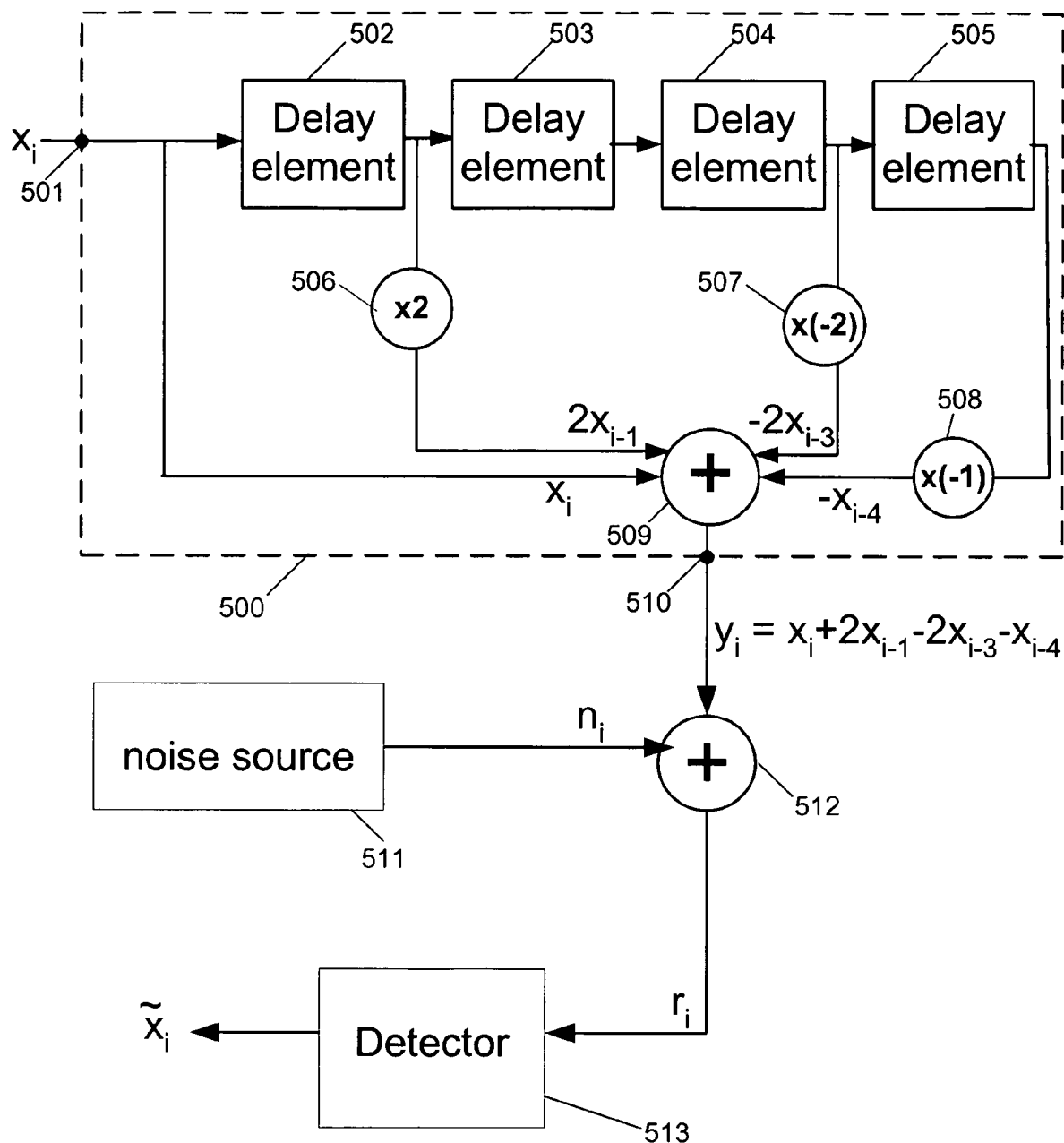
FIG. 6 is a block diagram of a convolution encoder which represents a E2PR4 hard disk reading process.

FIG. 6 shows a block diagram of the E2PR4 encoder 500, a transmission channel, and a detector 513. As in FIG. 2, a noise source 511 represents the effect of noise during transmission of the data.

The encoder has an input $x_i$ and four delay elements 502, 503, 504, 505 arranged in a pipelined structure such that input data passed from one delay element to the next at each clock cycle. The input $x_i$ connects to the input of the first delay element 502. The output of the first delay element 502 is passed to the input of the second delay element 503. The output of the second delay element 503 is passed to the input of the third delay element 504. The output of the third delay element 504 is passed to the input of the fourth delay element 505.

The delay elements 502, 504 and 505 are also arranged to output via multiplication units 506, 507 and 508 respectively, to a sum unit 509. Multiplication unit 506 multiplies the output of delay element 502 by two. Multiplication unit 507 multiplies the output of delay element 504 by minus two. Multiplication unit 508 multiplies the output of delay element 505 by minus one. The input $x_i$ is also connected to the sum unit 509. Thus, the sum unit calculates an output $y_i = x_i + 2x_{i-1} - 2x_{i-3} - X_{i-4}$.

Figure 2:
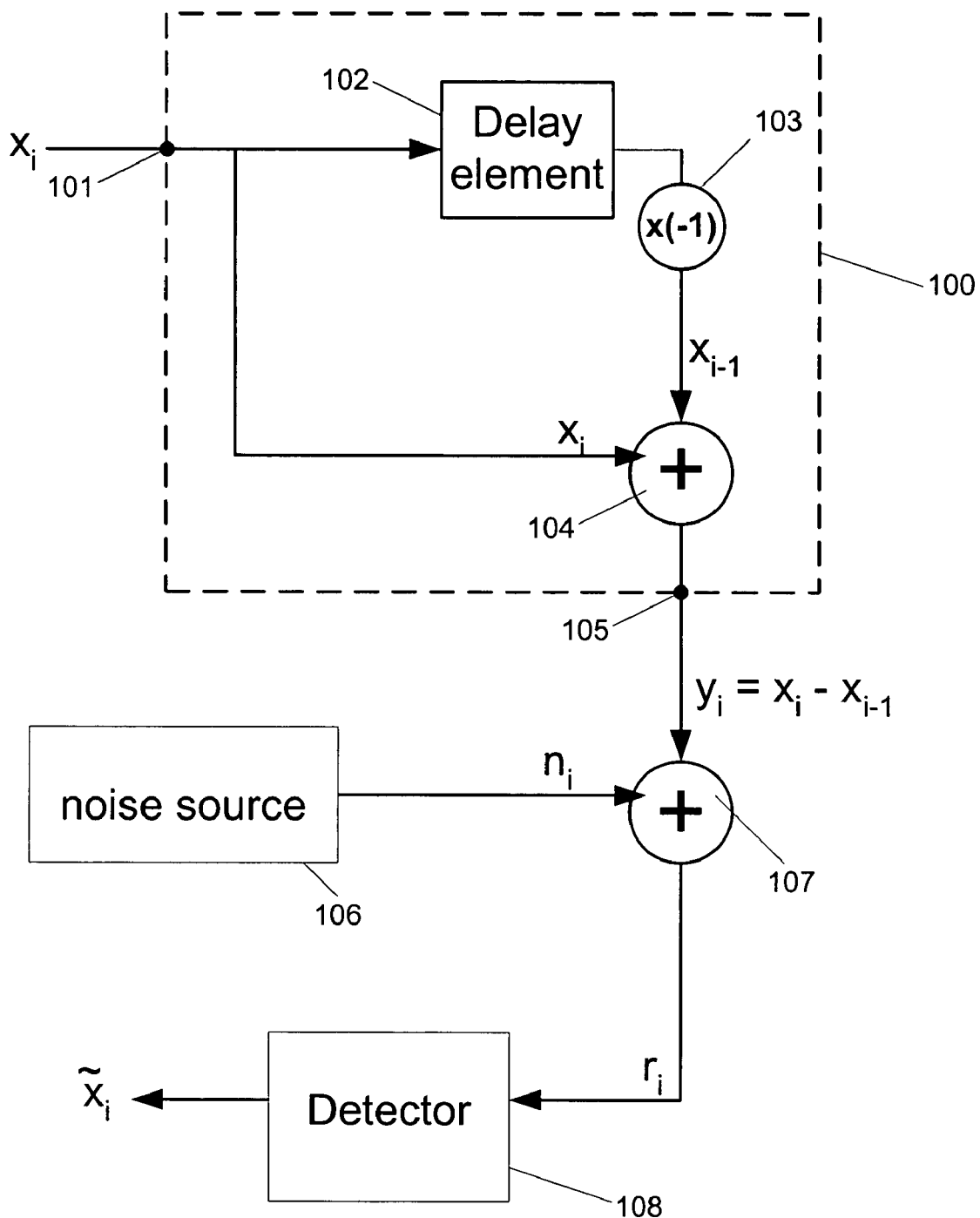
FIG. 2 is a block diagram of an apparatus for convolution encoding and decoding of data, according to the prior art.

As in FIG. 2, the encoder output signal $y_i$ is sent from the output 510 of the encoder 500 via a channel, such as a radio link, a wire, or any other form of data transmission channel, to a detector 513. Noise source 511 represents noise $n_i$ generated as the signal $y_i$ passes through the channel. The noise source may generate Gaussian white noise, but the actual form of the noise generated does not have to be Gaussian, although in this example, it must be de-correlated noise. A sum unit 512, with inputs connected to the noise source 511 and the encoder output 510, represents the addition of the noise $n_i$ to the data $y_i$. Thus, the signal received after the data has passed through the noisy channel is $r_i = y_i + n_i$. The detector 513 receives the signal $r_i$, and the detector then performs a decoding process.

Figure 7:
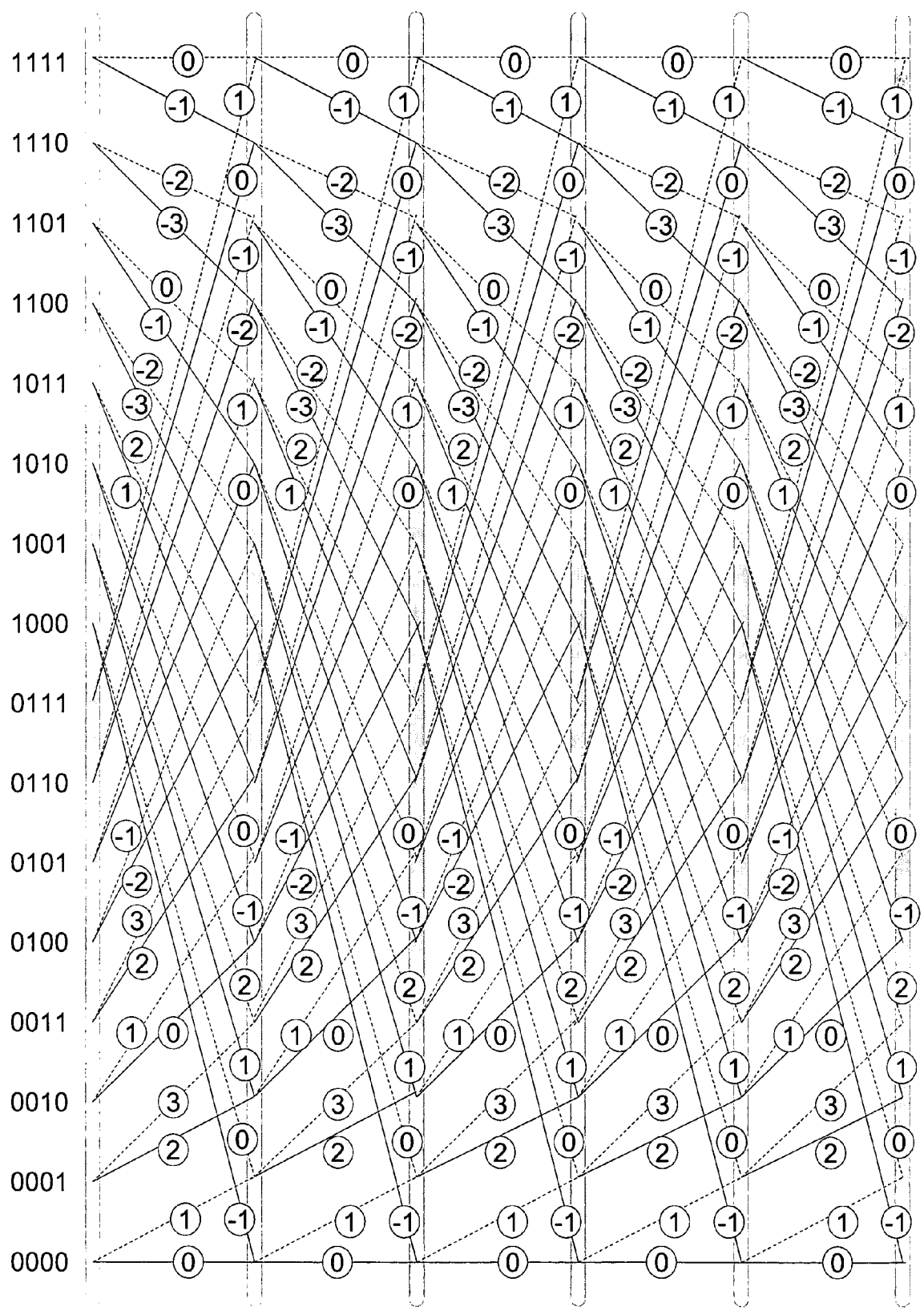
FIG. 7 is a trellis diagram for the encoder of FIG. 6.

In a second embodiment of the invention, the most likely path is found in a trellis corresponding to the E2PR4 apparatus of FIG. 6, using parallel processing techniques. The trellis diagram for a E2PR4 system is shown in FIG. 7, and has 16 states. Each state is a four digit binary number, which corresponds to the four bits stored in the four delay elements of the encoder. When a new data bit is received by the encoder, the previous data input bit is stored in the first delay element, and the bits in the delay elements are all shunted forwards by one delay element. Thus, for example, a state of 0000 may change either to a state 0000 or a state 0001, depending on whether the new data bit is a zero or a one respectively. Similarly, a state of 1110 may change to either 1100 or 1101.

A dashed line on FIG. 7 represents a state transition to a state including a new bit with a value of one, and an unbroken line represents a state transition to a state including a new bit with a value of zero.

A loop is formed when two different paths connect the same initial and final states. Thus, K=5 state changes are needed to form a loop in a E2PR4 system, because if the delay elements start with identical memory contents for both paths, and the first new bit is different for each path, it then takes a further four bits which are the same in each path in order to "flush" the delay elements, and once again, have identical delay element contents.

Figure 8:
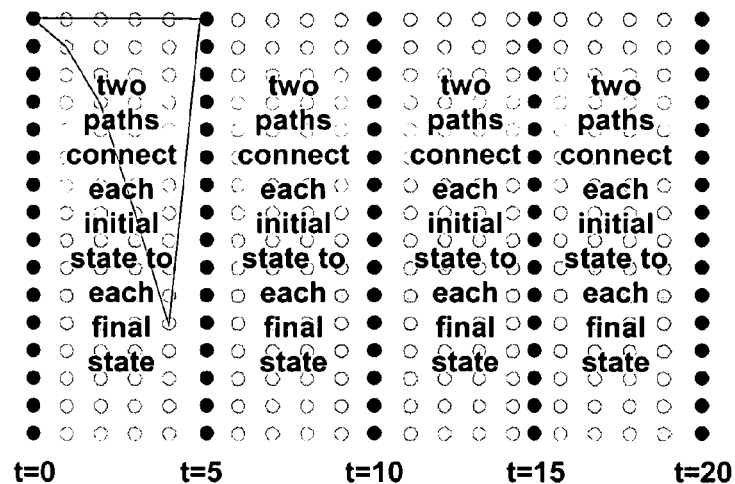
FIG. 8 shows partially connected trellis diagrams for three steps in the reduction of an E2PR4 trellis, according to a second embodiment of the invention.
Figure 8:
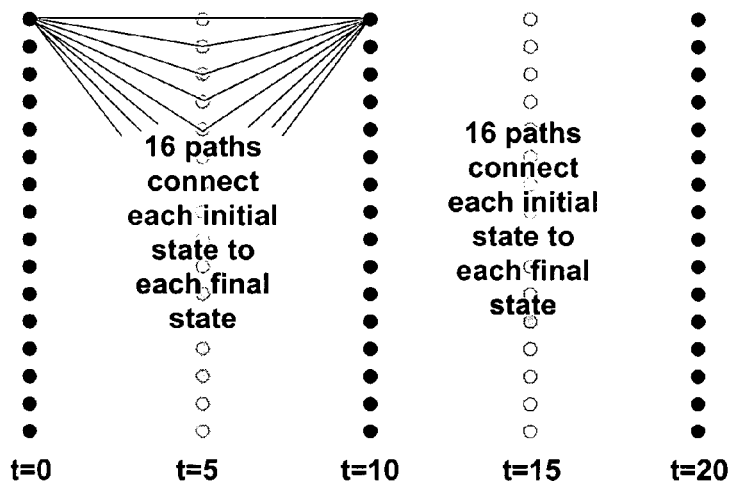
Figure 8:
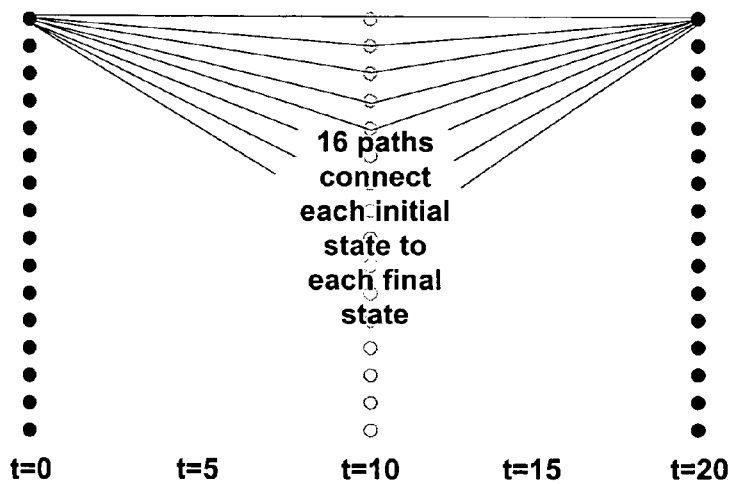

As shown in FIG. 8, the trellis of FIG. 7 is divided into sections each of length 5 state transitions. Half of the paths are then eliminated within each section, using VA. The trellis may then be re-drawn, omitting the discarded loops. The new trellis has 16 states, each of which has a single path to the following state. Thus, the new trellis differs from the original trellis in that 16 different paths are possible linking any state to the next state, instead of the two paths linking adjacent states in the original trellis diagram. Thus, in the reduced trellis diagram, loops can be constructed after only two steps. Therefore, to further divide the trellis, it is necessary to split the reduced trellis into sections of length two transitions.

These subdivided sections are reduced for all loops using VA and the trellis is again redrawn. The process of dividing the trellis, loop erase, and redrawing the trellis is repeated iteratively, until a trellis with only a single path is left. During each step of the process, each part of the trellis may be processed in parallel.

The first and second embodiments of the invention both relate to the situation where a finite length sequence of data is to be transmitted, i.e. the delay element can be preset to zero before transmission begins, and an extra zero can be transmitted at the end. The decoding method relies on the fact that the first and last states are known to be zero. However, an adaptation to this method is necessary when dealing with a continuous sequence of input data (or a sequence of data which is too long for the input buffer).

The prior art method of sliding-window VA will now be described. Then, the method of adapting the prior art technique with embodiments of the present invention will be described.

In sliding-window VA, according to the prior art, continuous data is dealt with by using an operating window of length W. Within the window, for every state at time T (the most recent time) and for every state at time T–W, the path of greatest likelihood that connects these states is found using standard VA. Once the greatest likelihood paths connecting each pair of states are calculated, the operating window is advanced forward by W bit cycles, and the trace-back is performed from the time T to T–W–P. The last W samples in the path memory window are outputted to the user.

Although standard VA normally uses a knowledge of both start and end states to fully reduce a trellis, sliding-window VA does not require this. Instead, sliding-window VA makes use of the fact that after a sufficiently long time interval, the most likely path will become effectively independent of the initial state. Thus, a set of paths of highest likelihood, each starting at a different possible state at time T, will tend to converge to a single path after a sufficiently long time period, because the initial state no longer has a significant influence on the encoder output at this time. The same principle also holds in reverse, i.e. a backwards convergence of paths occurs after tracing back for a sufficiently long time period. In general, when the probability P is very close to 1, all survivors at time T originate from the same survivor at time T–D, where D is the survivors' depth, which in general is approximately five times the constraint length. In this example, the paths can be assumed to converge within a length of 2W from the final state.

For certain timing processes, such as transmission of control signals back to the data transmitter, it is necessary to get "early" bit decisions. For example, if the detector needed to request data to be re-sent, due to excess noise, it would be necessary to generate the request, and set up the detector accordingly.

It can be assumed, for the purposes of obtaining an early decision, that the paths will converge closer to the output bit than many of them will actually do, so that traceback of the paths can be performed in less time. The result is not as accurate, and sometime, a non optimal path will be selected. However, it provides a working result, to allow time-critical control processes to function without delay. In other words timing circuits get an approximate answer provided quickly, but the user gets a better quality answer provided after a longer time delay. In a typical application, a read channel uses "early decisions" after approximately 15 bits rather than the approximately 40 bits used for data output.

As a result, the timing loop gets decisions that are accurate (e.g. the bit error rate, BER=1E-3) enough for it to run with low latency of 15 bits, since the loop latency is critical for timing recovery. And the read channel outputs the more accurate bits (e.g. BER=1E-6) to the user with higher latency.

To produce early decisions, it is sufficient to use decisions at the time T−W−C where C is small, e.g. 5 bits. This would increase the latency of early decisions relative to the classical radix-4 Viterbi implementation; however the only other high-speed Viterbi design alternative, a Fettweis approach, would also have a very high latency for early decisions.

Figure 9:
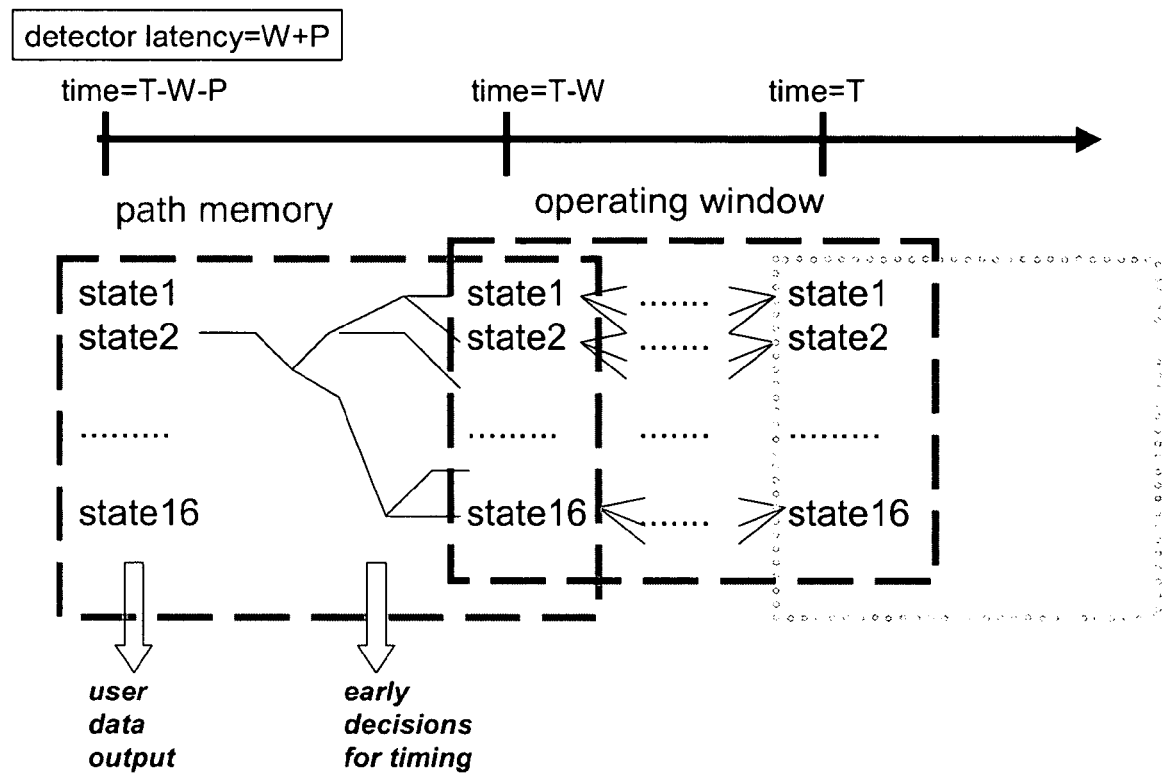
FIG. 9 is a schematic diagram illustrating a prior art method of sliding-window Viterbi decoding, which may be adapted in a third embodiment of the invention.

FIG. 9 shows a schematic diagram of a prior art sliding-window VA detector. The arrow pointing left to right at the top of the figure illustrates a time axis. A first processing window is shown, enclosed in a box with dashed outline, and beginning at time T−W−P and ending at time T−W. An operating windows of length W is shown as a box starting at time T−W and ending at time T. A dotted line shows the position of the next operating window, not actually yet used in this example, starting at time T and ending at time T+W.

Within the operating window from time T−W to time T, part of a trellis is represented, with 16 initial states and 16 final states. This part of the trellis can be reduced using standard VA, to obtain a single path connecting each initial state to each final state. To find which initial state should be selected out of the 16 initial states, it is necessary to look back to the part of the trellis between time T−W−P and T−W. The final state in this section of the trellis is unknown. However, by retracing the path from T−W backwards, it is observed that the most likely paths for each state at T−W will converge after a certain number of steps. Thus, the path can be determined at times earlier than that point of convergence, leaving a branching path after that point of convergence. The state at time T−W can be found by moving the process on to the next operating window, such that the convergence occurs at a later time. The latency W+P of the detector is the delay between the data being received at time T for processing in an operating window, and the previous time at which all the paths are highly likely to become independent of the state at time T.

A third embodiment of the invention allows continuous decoding of the convolution encoded data. To do this, an embodiment of the invention is used to reduce the trellis in the operating window, instead of using standard VA. This speeds up the process and allows faster transmission of the data.

A specific example is now discussed, in which two 5×16 blocks are made to work in parallel to determine 256 shortest paths of length 10 from any initial state at T to any state at T+10. After this computation each state at T+10 is connected to all 16 states at T. As path metrics of shortest paths to all states at T is known, path metrics of all 16 paths coming to each state at T+10 can be calculated, and the shortest path can be computed using binary tree of comparisons. Thus there are 16 add-compare blocks which reduce 256 paths to 16. This design consists of three stages, where only the last stage needs the knowledge of path metrics. This design can be very naturally pipelined—the computation in a new window can start before the computation of the updated path metric is finished.

The trace back path of this design is very similar to a standard Viterbi, but there is a simplification, due to the fact that embodiments of the invention choose paths in chunks, so one needs to store less info about survivors: instead of 11 states crossed by the path, it is necessary to know first state, final state and whether upper part of the loop has been chosen (code 1) or lower part of the loop has been chosen (code 0).

One possible simplification to the overall algorithm with large W can include reducing the number of states at time T−W that need to be connected to every state at time T. For example instead of finding all 16×16=256 maximum likelihood paths, it may be sufficient, by implementing code constraints during trace back, to find 8×16=128 maximum likelihood paths connecting 8 states at time T−W (with the smallest path metrics) to all 16 states at time T.

Sliding-window VA based on analysing trellis segment of length 1 at a time is called 1 radix-2 VA. However, the present invention is not limited to radix-2. Current Viterbi chips have radix 4

Some embodiments of the invention will now be described, for designs using an E2PR4 partial response channel. These designs accept hard inputs and produce hard outputs (the simplest scenario possible). The area and the delay of the following path metric units (PMUs), used to calculate path metrics, are measured relative to an adder with an area of 1 unit and a delay of 1 unit. The fact that the adders' width can change as the radix increases is not important for comparing the ratios of complexities of various algorithms for a given value of radix.

The area of a radix-$2^n$ path metric unit built according to an embodiment of the invention is $A(n) \leq 48 \cdot 2^n + 24 \cdot n + 16$ for n<5. The length of the critical path, determining the delay, is $T_{cp}=1+n$. If n=5, then a separate computation shows that A(5)=1250, and $T_{cp}=5$. Thus, the length of the critical path for a radix-$2^5$ design is the same as for a radix-$2^4$ design, but the complexity increase is only about 50 per cent. In contrast, the area and the critical path's length of a conventional radix-$2^n$ unit is $A_{ref}(n)=16 \cdot (n+1) \cdot 2^n 30\ 8 \cdot (n-2)$, $T_{ref}=1+n$.

In embodiments of the invention for n<5, the multiplier of $2^n$ is constant in the equation for area A(n), but the critical path length grows linearly with n. As a result, embodiments of the present invention have, for large values of radix, a lower complexity (measured in terms of speed area product for example) than conventional designs. Examples are shown in the following table, where $A_{reference}$ is the area for a conventional design and $A_{PMU}$ is the area for an embodiment of the invention:

| n | $A_{reference}$ | $A_{PMU}$ | $A_{reference}/A_{PMU}$ |
|---|---|---|---|
| 2 | 192 | 256 | 0.8 |
| 3 | 520 | 472 | 1.1 |
| 4 | 1296 | 880 | 1.5 |
| 5 | 3096 | 1250 | 2.5 |

The latency is determined by the amount of computation which has to be performed before the feedback loop. Therefore, the lower the complexity of the whole design the lower the latency. The speed of the pre-computation can be increased by increasing silicon area, so that latency can be traded off for area. Details of a radix-$2^5$ design, generated using computer simulation software, are given below. The synthesis has been performed in TSMC 0.131 v library. The worst operational conditions have been assumed (Voltage: 0.9 v, temperature: 125C.)

2 Gbits/sec design:
Generator polynomial: $(1-D^2)\cdot(1+D)^2$
The width of input signals: 7 bits
Latency: 35 bits
Area: 0.90 mm$^2$
Clock frequency: 400 MHz
Throughput: 2.0 Gbits/sec
Methodology: Standard cell timing at synthesis; Artisan TSMC 0.131 v library, slow corner.

Details of a Radix-$2^8$ designs are given below, where the numbers are an estimate based on the block scheme of the design. The theoretical complexity estimate of radix-$2^8$ decoder is $A(8)\approx1900$, $T_{cp}=3$, where the quaternary ACS tree is assumed. The performance of radix-$2^8$ design can be estimated using knowledge of the scaling of building blocks of radix-$2^5$ design with frequency and complexity of radix-$2^5$ design.

The estimated accuracy of the area figure is 20 per cent. The estimates are performed for the same library/operation conditions as above.
Generator polynomial: $(1-D^2)\cdot(1+D)^2$
The width of input signals: 7 bits
Latency: 48 bits
Area: 1 mm$^2$
Clock frequency: 370 MHz
Throughput: 3 Gbits/sec Further embodiments of the present invention include decoders with other values of the radix, for example, radix-$2^{10}$ E$^2$PR4 decoders, and programmable decoders such as a programmable E$^2$PR4 decoder with the generator polynomial $(1-D^2)\cdot(1+\alpha\cdot D+\beta\cdot D^2)$.

Further embodiments of the present invention provide building blocks which can be combined in a standard way to achieve an ultra-high throughput. For example, an arrangement of four path metric units and two trace back units can be constructed, and will be able to decode in the midstream. Such arrangements work independently of each other and using sufficiently many of them, in principle any throughput can be achieved.

The building blocks can be arranged as two path metric units connected by a best path selector. Their role is to perform acquisition iteration. It is followed by two blocks which perform the second ACS iteration. The main advantage of such an arrangement is its ability to decode in the midstream. Therefore, a design consisting of n such arrangements decoding in parallel, will be n times larger and n times faster than a single arrangement. Its latency will be the same as the latency of a single arrangement.

Based on the numbers above, the main advantages arising from the use of embodiments of the present invention to implement maximal likelihood decoding are: very high speed and very low latency due to parallelism of the architecture; very low power consumption due to, firstly, elimination of redundancies the computation of path metrics, secondly, low clock speed, which is in turn due to the amount of computations performed each cycle.

The present invention can be extended to other encoders with a larger constraint length than K=2, as well as the E2PR4 example with K=5. The minimum length of a loop is always one greater than the number of buffers to be filled, because if the initial states are identical, but different second states occur, the paths cannot converge again until the buffer contents have been completely replaced by a new identical sequence.

It is possible to use the invention with hard inputs or soft inputs and hard outputs or soft outputs. In further embodiments of the present invention, turbo codes are used. A turbo encoder is a combination of two simple encoders, where the input data is permuted by an interleaver before input to one of the two simple encoders.

The present invention may be implemented as a dedicated semiconductor chip. Embodiments of the invention may be constructed using at least one standard cell. A standard cell is a logic unit which may be used as a building block for building more complex circuits. Standard cells may be made available as selections from a standard cell library. A customised selection of logic units from the library may be provided on a single chip to allow simplification of a particular implementation of the logic units. In addition, embodiments of the invention may be provided as standard cells, and made available within a standard cell library. However, the present invention is not limited to such a technology or design. A further embodiment of the invention is an integrated circuit including any detector according to the invention. The invention also encompasses circuit boards including any detector according to the invention, and digital electronic devices including any detector according to the invention.

The present invention can be implemented by software or programmable computing apparatus. This includes any computer, including PDAs (personal digital assistants), mobile phones, etc. Thus the present invention encompasses a carrier medium carrying computer readable code for configuring a computer or number of computers as the apparatus of the invention. The carrier medium can comprise a transient medium, e.g. an electrical, optical, microwave, RF, electromagnetic, acoustic or magnetic signal (e.g. a TCP IP signal over an IP network such as the internet), or a carrier medium such as signal lines to carry the signal, a floppy disk, CD ROM, hard disk, or programmable memory device.

The code for each process in the methods according to the invention may be modular, or may be arranged in an alternative way to perform the same function. The methods and apparatus according to the invention are applicable to any computer.

VA can be used in a wide range of communications technology, including 3G cellular technology (e.g. CMDA2000, W-CDMA, TD-SCDMA), digital video broadcasting (DVB), digital audio broadcasting (DAB), broadband wireless (e.g. LMDS—local multipoint distribution service), multipoint multichannel distribution service (MMDS), wireless LAN (local area network) such as WLAN-802.11a, digital subscriber line technology (xDSL), cable modem and satellite communications. The present invention may be used in any situation where standard VA is used, including any of the above.

The present invention may also be applied in other fields of technology where Viterbi is used, such as DNA matching.

While the main embodiment described for the data processing apparatus is a detector for decoding convolution encoded data, such as in communications systems or hard disk read systems, many other uses are also possible. For instance, in speech recognition systems, traffic control systems, etc, the aim is to decode measured data which has a level of error, to find the most likely state sequence in a finite state model of the process. Viterbi can be used in such systems, and so can the method and apparatus of the present invention.

Embodiments of the present invention may include a maximum likelihood detector for receiving a stream of data values which correspond to ideal values but which may include added noise, and outputting information specifying a sequence of states of maximum likelihood selected from a plurality of possible states corresponding to the stream of data values, said ideal values being determined by the possible states, the maximum likelihood detector comprising: a pre-processor programmed to obtain or calculate first weighting values indicating likelihoods that each data value corresponds respectively to each of a plurality of said ideal data values; a plurality of processors arranged in a hierarchical structure, wherein each processor in a lowest level of the hierarchy is programmed to use a plurality of the first weighting values to calculate second weighting values indicating respective likelihoods that a section of the stream of data values corresponds to each of a plurality of possible state sequences, the section comprising one or more possible initial state and one or more possible final states; and, for each said possible initial state and each said possible final state, to select a second weighting value of highest likelihood corresponding to a state sequence from the initial state to the final state, and each processor in a level above the lowest level of the hierarchy is programmed to use weighting values calculated at a lower level of the hierarchy to calculate third weighting values indicating respective likelihoods that a sequence of data values comprising a plurality of adjacent sections corresponds to each of a plurality of possible state sequences, said sequence of adjacent sections comprising one or more possible initial states and one or more possible final states; and, for each said possible initial state and said each possible final state, to select a third weighting value of highest likelihood corresponding to a state sequence from the initial state to the final state; and an output generator to output information specifying a state sequence of highest likelihood according to the weighting value selections made by the plurality of processors.

While the invention has been described in terms of what are at present its preferred embodiments, it will be apparent to those skilled in the art that various changes can be made to the preferred embodiments without departing from the scope of the invention, which is defined by the claims.

The invention claimed is:

1. A maximum likelihood detector for receiving a stream of data values which correspond to ideal values but which may include added noise, and outputting information specifying a sequence of states of maximum likelihood corresponding to the stream of data values, said ideal values being determined by the possible states, the maximum likelihood detector comprising:
   means for obtaining first weighting values indicating likelihoods that each data value corresponds respectively to each of a plurality of said ideal data values;
   a plurality of processing means arranged in a hierarchical structure, wherein
   each processing means in a lowest level of the hierarchy is adapted to use a plurality of said first weighting values to calculate second weighting values indicating respective likelihoods that a section of the stream of data values corresponds to each of a plurality of possible sequences of states, the section comprising one or more possible initial states and one or more possible final states; and, for each said possible initial state and each said possible final state, to select a second weighting value of highest likelihood corresponding to a state sequence from the initial state to the final state, and
   each processing means in a level above the lowest level of the hierarchy is adapted to use weighting values calculated at a lower level of the hierarchy to calculate third weighting values indicating respective likelihoods that a sequence of data values comprising a plurality of adjacent sections corresponds to each of a plurality of possible state sequences, said sequence of adjacent sections comprising one or more possible initial states and one or more possible final states; and, for each said possible initial state and said each possible final state, to select a third weighting value of highest likelihood corresponding to a state sequence from the initial state to the final state; and
   output means to output information specifying a state sequence of highest likelihood according to the weighting value selections made by the plurality of processing means.

2. A maximum likelihood detector as claimed in claim 1, wherein the size of each said section is less than five times the shortest length within the stream of data values having two or more possible state sequences between each initial state and each final state.

3. A maximum likelihood detector as claimed in claim 1, wherein each section has a size equal to the shortest length within the stream of data values having two or more possible state sequences between each initial state and each final state.

4. A maximum likelihood detector as claimed in claim 1, wherein said processing means are arranged in a binary tree structure.

5. A maximum likelihood detector as claimed in claim 1, further comprising resolving means to use predetermined information about the first and last states corresponding to the stream of data values for outputting information specifying a sequence of states of highest likelihood corresponding to the stream of data values.

6. A maximum likelihood detector as claimed in claim 5, wherein said resolving means is adapted to use each of a plurality of different possible initial and/or final states for outputting information specifying a sequence of states of highest likelihood corresponding to each said different possible initial and/or final states.

7. A maximum likelihood detector as claimed in claim 6, wherein the resolving means is configured to output information specifying a predetermined proportion of all possible state sequences, chosen as those state sequences of highest likelihood.

8. A maximum likelihood detector as claimed in claim 5, wherein the resolving means is configured to output information specifying a plurality of state sequences, each of which has a likelihood above a given threshold.

9. A maximum likelihood detector as claimed in claim 1, wherein each processing means is adapted to select one state sequence according to a random or predetermined criteria if two or more state sequences have weighting values indicating equal likeliness.

10. A maximum likelihood detector as claimed in claim 1, further comprising initial processing means to pre-process data into a format suitable for reducing the number of equally likely sequences of states.

11. A maximum likelihood detector as claimed in claim 1, wherein the initial processing means and/or processing means are structured with a pipelined architecture for sequentially inputting a plurality of streams of data values, and pre-processing and/or processing a first stream of data values at the same time as pre-processing and/or processing a second stream of data values.

12. A maximum likelihood detector as claimed in claim 11, wherein the output means is adapted to output information specifying an early estimate of a sequence of states of maximum likelihood by selecting a state within said first stream of data values and using the Viterbi algorithm to determine the corresponding state sequence of maximum likelihood within the second stream of data values, over a length for which the probability is above a predetermined threshold for obtaining the same state sequence regardless of said selected state.

13. A maximum likelihood detector as claimed in claim 1, further comprising storage means for storing a plurality of possible state sequences corresponding to the stream of data values, the storage means being adapted to eliminate one or more state sequences from the stored plurality of possible state sequences as a result of each processing means selection of a weighting value from a plurality of weighting values.

14. A maximum likelihood detector as claimed in claim 1, wherein the ideal values correspond to convolution encoded values, said sections each have a size greater than or equal to a constraint length of the convolution encoded values, and the output means is configured to output corresponding deconvolved values.

15. A maximum likelihood detector as claimed in claim 14, wherein the first level processing means are each configured to process sequences of encoded data with a constraint length of 2.

16. A maximum likelihood detector as claimed in claim 14, wherein the first level processing means are each configured to process sequences of encoded data with a constraint length of 5.

17. A maximum likelihood detector as claimed in claim 14, wherein the first level processing means are each configured to process a section having a size less than five times the constraint length.

18. A maximum likelihood detector as claimed in claim 14, wherein the first level processing means are configured to receive a signal indicating the value of the constraint length for a particular sequence of data values, and adapt to use that value of the constraint length in determining the section length for that particular sequence of data values.

19. A maximum likelihood detector as claimed in claim 14, further comprising storage means for storing a block of $K^n$ received data items, where K is a constraint length of the received data items, and n is the number of levels in the hierarchy of processing means which is necessary for decoding, and wherein any additional data in the storage means is stored until the maximum likelihood detector is ready to process a next block of $K^n$ data items.

20. A maximum likelihood detector as claimed in claim 1, wherein the ideal values are equal to the possible states.

21. A maximum likelihood detector as claimed in claim 1, adapted to receive a continuous sequence of data values, and to divide the continuous sequence into a plurality of said streams of data values.

22. A maximum likelihood detector as claimed in claim 1, wherein said means for obtaining comprises pre-processing means for calculating said first weighting values.

23. A maximum likelihood detector as claimed in claim 22, wherein the pre-processing means is adapted to perform parallel calculation of first weighting values for use by each of a plurality of first level processing means.

24. A maximum likelihood detector as claimed in claim 22, wherein the pre-processing means is adapted to calculate each first weighting value as the square of the difference between a received data value and the value of a state.

25. A maximum likelihood detector as claimed in claim 22, wherein the pre-processing means is adapted to calculate each first weighting value using a received data value, the value of a state, and a noise correlation estimate.

26. A data traffic flow controller including the maximum likelihood detector of claim 1.

27. A magnetic data storage device including the maximum likelihood detector of claim 1.

28. A hard disk read head including the maximum likelihood detector of claim 1.

29. A hard disk read head decoding unit comprising the maximum likelihood detector of claim 1.

30. A hard disk drive including the maximum likelihood detector of claim 1.

31. A computer apparatus containing the hard disk drive of claim 30.

32. An optical data storage device including the maximum likelihood detector of claim 1.

33. A communications receiver including the maximum likelihood detector of claim 1.

34. A computer configured as the maximum likelihood detector of claim 1.

35. A maximum likelihood detector for receiving a stream of data values which correspond to ideal values but which may include added noise, and outputting information specifying a sequence of states of maximum likelihood selected from a plurality of possible states corresponding to the stream of data values, said ideal values being determined by the possible states, the maximum likelihood detector comprising:

a pre-processor programmed to obtain or calculate first weighting values indicating likelihoods that each data value corresponds respectively to each of a plurality of said ideal data values;

a plurality of processors arranged in a hierarchical structure, wherein each processor in a lowest level of the hierarchy is programmed to use a plurality of the first weighting values to calculate second weighting values indicating respective likelihoods that a section of the stream of data values corresponds to each of a plurality of possible state sequences, the section comprising one or more possible initial state and one or more possible final states; and, for each said possible initial state and each said possible final state, to select a second weighting value of highest likelihood corresponding to a state sequence from the initial state to the final state, and each processor in a level above the lowest level of the hierarchy is programmed to use weighting values calculated at a lower level of the hierarchy to calculate third weighting values indicating respective likelihoods that a sequence of data values comprising a plurality of adjacent sections corresponds to each of a plurality of possible state sequences, said sequence of adjacent sections comprising one or more possible initial states and one or more possible final states; and, for each said possible initial state and said each possible final state, to select a third weighting value of highest likelihood corresponding to a state sequence from the initial state to the final state; and an output generator to output information specifying a state sequence of highest likelihood according to the weighting value selections made by the plurality of processors.

36. A method of maximum likelihood detection for receiving a stream of data values which correspond to ideal values but which may include added noise, and outputting information specifying a sequence of states of maximum likelihood corresponding to the stream of data values, said ideal values being determined by the possible states, the method comprising:

obtaining first weighting values indicating likelihoods that each data value corresponds respectively to each of a plurality of said ideal data values;

processing said first weighting values in a hierarchical manner, by:

in a lowest level of the hierarchy, using a plurality of the first weighting values to calculate second weighting values indicating respective likelihoods that each of a plurality of sections of the stream of data values corresponds to each of a plurality of possible state sequences, each section comprising one or more possible initial state and one or more possible final states; and, for each said possible initial state and each said possible final state for each section, selecting a second weighting value of highest likelihood corresponding to a state sequence from the initial state to the final state, and in a level above the lowest level of the hierarchy, for each of a plurality of groups of adjacent sections, using weighting values calculated at a lower level of the hierarchy to calculate third weighting values indicating respective likelihoods that a sequence of data values comprising a group of adjacent sections corresponds to each of a plurality of possible state sequences, the group of sections comprising one or more possible initial states and one or more possible final states; and, for each said possible initial state and said each possible final state for each group of sections, selecting a third weighting value of highest likelihood corresponding to a state sequence from the initial state to the final state; and outputting information specifying a state sequence of highest likelihood according to the weighting value selections made during the hierarchical processing.

37. A method as claimed in claim 36, wherein the size of each said section is less than five times the shortest length within the stream of data values having two or more possible state sequences between each initial state and each final state.

38. A method as claimed in claim 36, wherein each section has a size equal to the shortest length within the stream of data values having two or more possible state sequences between each initial state and each final state.

39. A method as claimed in any one of claims 36, wherein said processing hierarchy is a binary tree structure.

40. A method as claimed in any one of claims 36, wherein the pre-processing performs parallel calculation of first weighting values for use in the first level processing.

41. A method as claimed in any one of claims 36, comprising receiving predetermined information about the first and last states corresponding to the stream of data values, and further comprising using said predetermined information for outputting information specifying a sequence of states of highest likelihood corresponding to the stream of data values.

42. A method as claimed in claim 41, further comprising using each of a plurality of different possible initial and/or final states for outputting information specifying a sequence of states of highest likelihood corresponding to each said different possible initial and/or final states.

43. A method as claimed in claim 41, further comprising outputting information specifying a plurality of state sequences, each of which has a likelihood above a given threshold.

44. A method as claimed in claim 41, further comprising outputting information specifying a predetermined proportion of all possible state sequences, chosen as those state sequences of highest likelihood.

45. A method as claimed in any of claims 36, wherein one state sequence is selected for each section or group of sections according to a random or predetermined criteria if two or more state sequences have weighting values indicating equal likeliness.

46. A method as claimed in any of claims 36, further comprising pre-processing the stream of data values into a format suitable for reducing the number of equally likely sequences of states.

47. A method as claimed in any of claims 36, comprising using a pipelined architecture for sequentially inputting a plurality of streams of data values, and pre-processing and/or processing a first stream of data values at the same time as pre-processing and/or processing a second stream of data values.

48. A method as claimed in claim 47, further comprising outputting information specifying an early estimate of a sequence of states of maximum likelihood by selecting a state within said first stream of data values and using the Viterbi algorithm to determine the corresponding state sequence of maximum likelihood within the second stream of data values, over a length for which the probability is above a predetermined threshold for obtaining the same state sequence regardless of said selected state.

49. A method as claimed in claim 36, further comprising storing a plurality of possible state sequences corresponding to the stream of data values, and eliminating one or more state sequences from the stored plurality of possible state sequences as a result of each processing means selection of a weighting value from a plurality of weighting values.

50. A method as claimed in claim 36, wherein the ideal values correspond to convolution encoded values, and said sections each have a size greater than or equal to a constraint length of the convolution encoded values.

51. A method as claimed in claim 50, wherein said sections each have a size less than five times the constraint length.

52. A method as claimed in claim 50, wherein the first level processing receives a signal indicating the value of the constraint length for a particular sequence of data values, and uses that value of the constraint length in determining the section length for that particular sequence of data values.

53. A method as claimed in claim 50, further comprising storing a block of $K^n$ received data items, where K is the constraint length, and n is the number of levels in the hierarchy of processing which is necessary for decoding, and storing any additional data until the maximum likelihood detector is ready to process a next block of $K^n$ data items.

54. A method as claimed in claim 50, comprising outputting deconvolved values corresponding to said convolution encoded values.

55. A method as claimed in claim 50, wherein the first level processing processes sections comprising sequences of encoded data with a constraint length of 2.

56. A method as claimed in claim 50, wherein the first level processing processes sections comprising sequences of encoded data with a constraint length of 5.

57. A method as claimed in claim 36, further comprising calculating each first weighting value as the square of the difference between a received data value and the value of a state.

58. A method as claimed in claim 36, further comprising calculating each first weighting value using a received data value, the value of a state, and a noise correlation estimate.

59. A method as claimed in claim 36, further comprising receiving a continuous sequence of data values, and dividing the continuous sequence into a plurality of said streams of data values.

* * * * *